US010657853B2

(12) United States Patent
French et al.

(10) Patent No.: US 10,657,853 B2
(45) Date of Patent: May 19, 2020

(54) IDENTIFIABLE ELEMENT, DISPLAY DEVICE, METHOD OF MANUFACTURING THE SAME, AND METHOD OF FORMING A DISPLAY PATTERN

(71) Applicant: E Ink Holdings Inc., Hsinchu (TW)

(72) Inventors: Ian French, Hsinchu (TW); Chun-Wei Chu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 357 days.

(21) Appl. No.: 15/725,280

(22) Filed: Oct. 4, 2017

(65) Prior Publication Data

US 2018/0122274 A1 May 3, 2018

(30) Foreign Application Priority Data

Oct. 31, 2016 (CN) .......................... 2016 1 0939035
Dec. 28, 2016 (CN) .......................... 2016 1 1231461

(51) Int. Cl.
*G02F 1/167* (2019.01)
*G09F 9/302* (2006.01)
(Continued)

(52) U.S. Cl.
CPC .............. *G09F 9/302* (2013.01); *C25D 1/16* (2013.01); *G02F 1/0126* (2013.01); *G02F 1/167* (2013.01);
(Continued)

(58) Field of Classification Search
CPC ............. G02F 1/167; G02F 2001/1678; G02F 1/1681; G02F 1/1676; G09G 3/344
(Continued)

(56) References Cited

U.S. PATENT DOCUMENTS 4,686,524 A    8/1987  White
4,779,127 A *  10/1988 Honjo ................. H01L 27/0605
                                                    257/272
(Continued)

FOREIGN PATENT DOCUMENTS

JP    08-153343    6/1996
TW     383108     2/2000

OTHER PUBLICATIONS

Corresponding Taiwanese Office Action that the prior art references were cited dated Aug. 11, 2017.

*Primary Examiner* — Mohammed A Hasan
(74) *Attorney, Agent, or Firm* — CKC & Partners Co. LLC

(57) ABSTRACT

A method of manufacturing an identifiable element, includes: providing or receiving a display layer, which includes an bistable layer, an electrode layer, an conductive transparent layer, and a light-trigger electric change layer, in which the electrode layer and the conductive transparent layer are disposed at opposite sides of the electrophoretic layer, and the light-trigger electric change layer is disposed between the electrophoretic layer and the conductive transparent layer; applying a voltage bias across the electrode layer and the conductive transparent layer; and providing a light illuminating a portion of the light-trigger electric change layer through the conductive transparent layer to change a display status of a region of the bistable layer corresponding to the illuminated portion, whereby forming a display pattern in the display layer. An identifiable element is provided herein as well.

25 Claims, 23 Drawing Sheets

(51) Int. Cl.
*H01L 51/00* (2006.01)
*C25D 1/16* (2006.01)
*G09F 9/37* (2006.01)
*G09G 3/34* (2006.01)
*G02F 1/01* (2006.01)

(52) U.S. Cl.
CPC ............ *G09F 9/372* (2013.01); *G09G 3/344* (2013.01); *H01L 51/0091* (2013.01); *G09G 2360/142* (2013.01)

(58) Field of Classification Search
USPC ........................................................ 359/296
See application file for complete search history.

(56) References Cited

U.S. PATENT DOCUMENTS

| | | | |
|---|---|---|---|
| 4,881,110 A * | 11/1989 | Braatz | G02F 1/015 257/443 |
| 6,623,042 B1 | 9/2003 | Jurgen et al. | |
| 7,320,936 B2 | 1/2008 | Brunet et al. | |
| 8,629,859 B2 | 1/2014 | Chuang et al. | |
| 2008/0035736 A1 | 2/2008 | Tompkin et al. | |
| 2016/0062206 A1* | 3/2016 | Paolini, Jr. | G02F 1/01 156/247 |

* cited by examiner

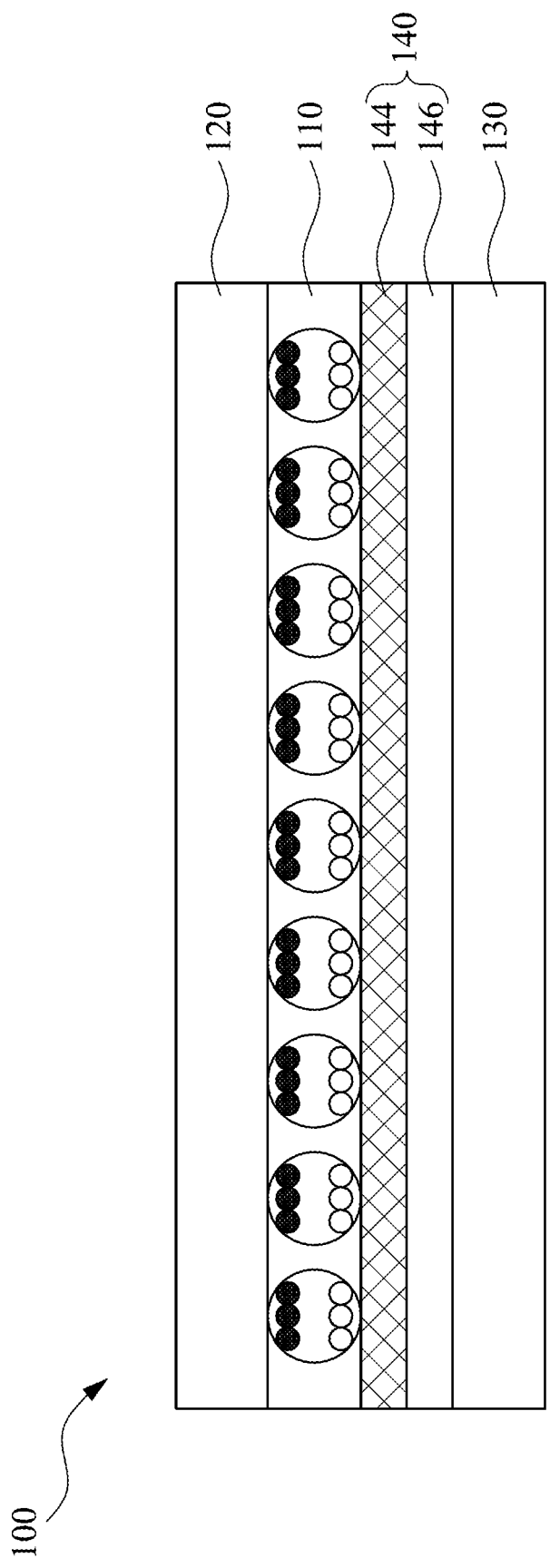

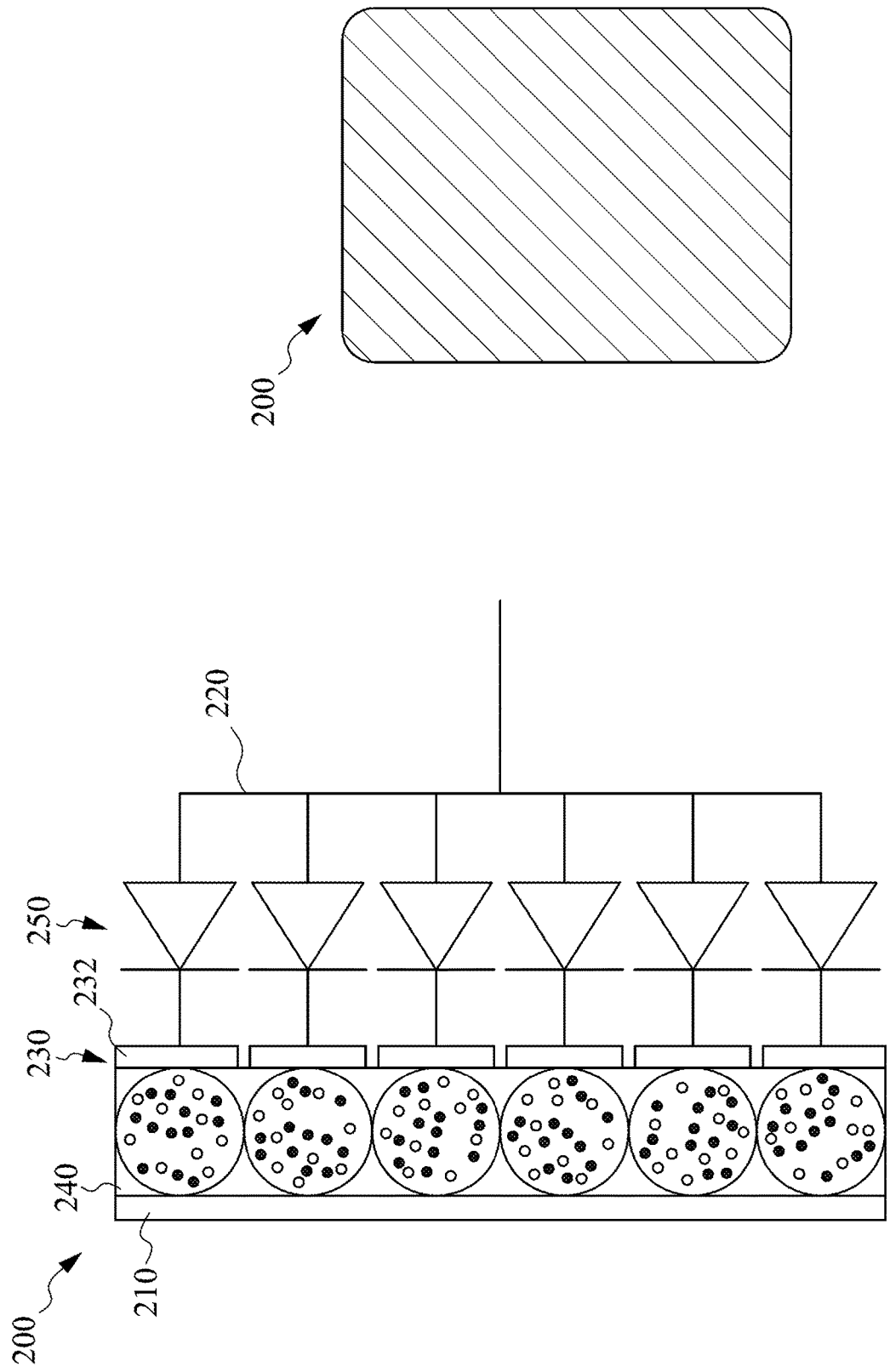

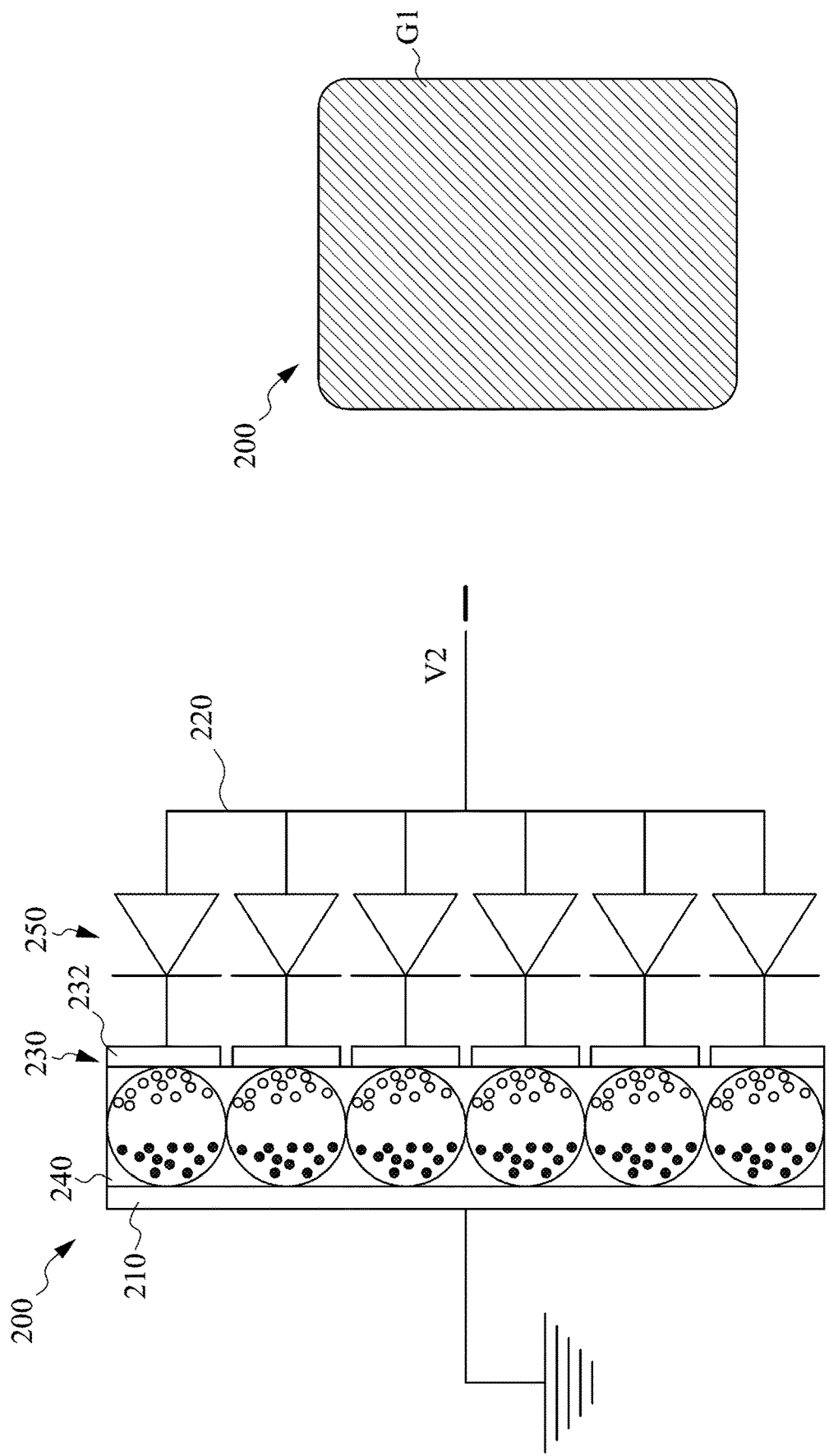

IDENTIFIABLE ELEMENT, DISPLAY DEVICE, METHOD OF MANUFACTURING THE SAME, AND METHOD OF FORMING A DISPLAY PATTERN

RELATED APPLICATIONS

This application claims priority to China Application Serial Number 201610939035.0, filed Oct. 31, 2016, and China Application Serial Number 201611231461.5, filed Dec. 28, 2016, the entities of which are incorporated herein by reference.

BACKGROUND

Technical Field

The present disclosure is related to an identifiable element, a display device, a method for manufacturing an identifiable element, and a method of forming a display pattern.

Description of Related Art

The basic structure of electrophoretic display devices was developed in the 1990s. In this technique, colored oil and charged white particles are filled in microcapsules. The charged white particles may be controlled to move up or down by external electric field, thereby showing different colors. In recent years, electrophoresis display devices have rapidly progressed in the application of electronic paper fields. The known electrophoretic display devices are equipped with active array substrates, and the active array substrates are used to drive the electrophoresis display devices. However, the manufacturing processes of the active array substrates are cumbersome, and therefore limit the application of electrophoresis display devices. Accordingly, there is a need for a new driving method or device to expand the application of the electrophoresis display devices.

SUMMARY

According to one aspect of the present disclosure, a method for manufacturing an identifiable element is provided. The method may form a display pattern of the identifiable element in a rapid and simple manner. The method includes the following operations: providing or receiving a display layer which comprises a bistable layer, an electrode layer, a conductive transparent layer, and a light-trigger electric change layer, in which the electrode layer and the conductive transparent layer are disposed at opposite sides of the bistable layer, and the light-trigger electric change layer is disposed between the bistable layer and the conductive transparent layer; applying a voltage bias across the electrode layer and the conductive transparent layer; and providing a light illuminating a portion of the light-trigger electric change layer through the conductive transparent layer so as to change a display status of a region of the bistable layer corresponding to the portion of the light-trigger electric change layer, whereby forming a display pattern in the display layer.

In some embodiments, when the light illuminates the portion of the light-trigger electric change layer, a conductivity of the portion of the light-trigger electric change layer increases or an electrical resistance of the portion of the light-trigger electric change layer decreases.

In some embodiments, when the light illuminates the portion of the light-trigger electric change layer, an electrical resistance of the portion of the light-trigger electric change layer increases.

In some embodiments, the bistable layer has a thickness direction and an extending direction perpendicular to the thickness direction, and the light-trigger electric change layer continuously extends in the extending direction a length which is capable of being recognized by human naked eyes.

In some embodiments, the method further comprises: removing the voltage bias and the light; and fixing the display layer having the display pattern to a carrier after removing the voltage bias and the light.

In some embodiments, the method further comprises: removing the voltage bias and the light; after removing the voltage bias and the light, removing the electrode layer from the display layer having the display pattern to expose a surface of the bistable layer, thereby forming a first identifiable element; and fixing the first identifiable element to a carrier.

In some embodiments, the method further comprises: removing the voltage bias and the light; after removing the voltage bias and the light, removing the conductive transparent layer and the light-trigger electric change layer from the display layer having the display pattern to expose a surface of the bistable layer, thereby forming a second identifiable element; and fixing the second identifiable element to a carrier.

In some embodiments, the method further comprises: removing the voltage bias and the light; after removing the voltage bias and the light, removing the electrode layer, the conductive transparent layer and the light-trigger electric change layer from the display layer having the display pattern to expose opposite surfaces of the bistable layer, thereby forming a third identifiable element; and fixing the third identifiable element to a carrier.

In some embodiments, the method further comprises: removing the voltage bias and the light; after removing the voltage bias and the light, removing the conductive transparent layer from the display layer having the display pattern, thereby forming a fourth identifiable element; and fixing the fourth identifiable element to a carrier.

According another aspect of the present disclosure, an identifiable element is provided. The identifiable element comprises a bistable layer, an electrode layer, a conductive transparent layer, and a light-trigger electric change layer. The electrode layer and the conductive transparent layer are disposed at opposite sides of the bistable layer. The light-trigger electric change layer is disposed between the bistable layer and the conductive transparent layer.

In some embodiments, the light-trigger electric change layer comprises a Schottky barrier generation layer and a semiconductor layer in contact with the Schottky barrier generation layer, in which the Schottky barrier generation layer is interposed between the bistable layer and the semiconductor layer, and the semiconductor layer is interposed between the Schottky barrier generation layer and the conductive transparent layer.

In some embodiments, the light-trigger electric change layer comprises a Schottky barrier generation layer and a semiconductor layer in contact with the Schottky barrier generation layer, in which the Schottky barrier generation layer is interposed between the semiconductor layer and the conductive transparent layer, and the semiconductor layer interposed between the bistable layer and the Schottky barrier generation layer, wherein the Schottky barrier generation layer is made of a transparent conductive material.

In some embodiments, the light-trigger electric change layer comprises a photosensitive conductive material.

According to some embodiments, a method of manufacturing an identifiable element is provided. The method comprises the following operations: providing a display layer which comprises a bistable layer, an electrode layer, a conductive transparent layer, and a light-trigger electric change layer, in which the electrode layer and the conductive transparent layer are disposed at opposite sides of the bistable layer, and the light-trigger electric change layer is disposed between the bistable layer and the conductive transparent layer; providing a light illustrating a portion of the light-trigger electric change layer through the conductive transparent layer; and applying a voltage bias across the electrode layer and the conductive transparent layer to change a display status of a region of the bistable layer corresponding to the portion of the light-trigger electric change layer, whereby forming a display pattern in the display layer.

According to yet some embodiments, a method of manufacturing an identifiable element is provided. The method comprises the following operations: providing or receiving a display layer which comprises a bistable layer, an electrode layer, a conductive transparent layer, and a light-trigger electric change layer, in which the electrode layer and the conductive transparent layer are disposed at opposite sides of the bistable layer, and the light-trigger electric change layer disposed is between the bistable layer and the conductive transparent layer; and providing a voltage bias across the electrode layer and the conductive transparent layer, and allowing a light to illuminate a portion of the light-trigger electric change layer through the conductive transparent layer, such that a display status of a region of the bistable layer corresponding to the portion of the light-trigger electric change layer is changed, thereby forming a display pattern in the display layer.

According to yet some embodiments, a display device is provided. The display device comprises a first conductive transparent layer, a second conductive transparent layer opposite to the first conductive transparent layer, a bistable layer disposed between the first conductive transparent layer and the second conductive transparent layer, and a photodiode structure layer disposed between the bistable layer and the second conductive transparent layer, in which the photodiode structure layer is electrically connected to the bistable layer.

In some embodiments, the display device further comprises a pixel electrode layer disposed between the bistable layer and the photodiode structure layer, in which the pixel electrode layer comprises a plurality of conductive pads discrete from each other.

In some embodiments, the photodiode structure layer comprises a first-type semiconductor layer, an intrinsic semiconductor layer disposed over the first-type semiconductor layer, and a second-type semiconductor layer disposed over the intrinsic semiconductor layer.

In some embodiments, the photodiode structure layer comprise a first-type semiconductor layer, an intrinsic semiconductor layer disposed over the first-type semiconductor layer, and a plurality of second-type semiconductor layers disposed over the intrinsic semiconductor layer, in which the second-type semiconductor layers define a plurality of photodiodes.

In some embodiments, each of the conductive pads is disposed on a corresponding one of the second-type semiconductor layers.

In some embodiments, two adjacent ones of the second-type semiconductor layers are separated by a trench, and the trench has a depth that is greater than a thickness of each of the second-type semiconductor layers.

According to yet some embodiments, a method of forming a display pattern is provided. The method comprises the following operations: providing or receiving a display device described hereinbefore; applying a first voltage bias across the first conductive transparent layer and the second conductive transparent layer; applying a second voltage bias across the first conductive transparent layer and the second conductive transparent layer, in which the second voltage bias is different from the first voltage bias; and allowing a light to illuminate a portion of the photodiode structure layer through the second conductive transparent layer such that a display status of a region of the bistable layer corresponding to the portion of the light-trigger electric change layer is changed, thereby forming a display pattern in the display device.

In some embodiments, when the first voltage bias is a positive voltage bias, the second voltage bias is a negative voltage bias, and when the first voltage bias is a negative voltage bias, the second voltage bias is a positive voltage bias.

In some embodiments, when applying the first voltage bias, the display device presents a first gray level over an entire display region of the display device, and when applying the second voltage bias, the display device still presents the first gray level over the entire display region.

In some embodiments, the light has a wavelength ranged from about 380 nm to about 580 nm.

In some embodiments, the operation of allowing the light to illuminate the portion of the photodiode structure layer through the second conductive transparent layer comprises providing a first light and a second light having different light intensities to respectively illuminate a first portion and a second portion of the photodiode structure layer, such that two regions of the bistable layer corresponding to the first portions and the second portion present two display patterns in different gray levels.

In some embodiments, the operation of allowing the light to illuminate the portion of the photodiode structure layer through the second conductive transparent layer comprises providing a first light and a second light having different wavelengths to respectively illuminate a first portion and a second portion of the photodiode structure layer, such that two regions of the bistable layer corresponding to the first portions and the second portion present two display patterns in different gray levels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are cross-sectional views schematically illustrating a display layer according to some embodiments of the present disclosure.

FIGS. 13A-16B are drawings schematically illustrating a method of forming the display pattern in various steps according to some embodiments of the present disclosure.

DESCRIPTION OF THE EMBODIMENTS

Figure 1A:
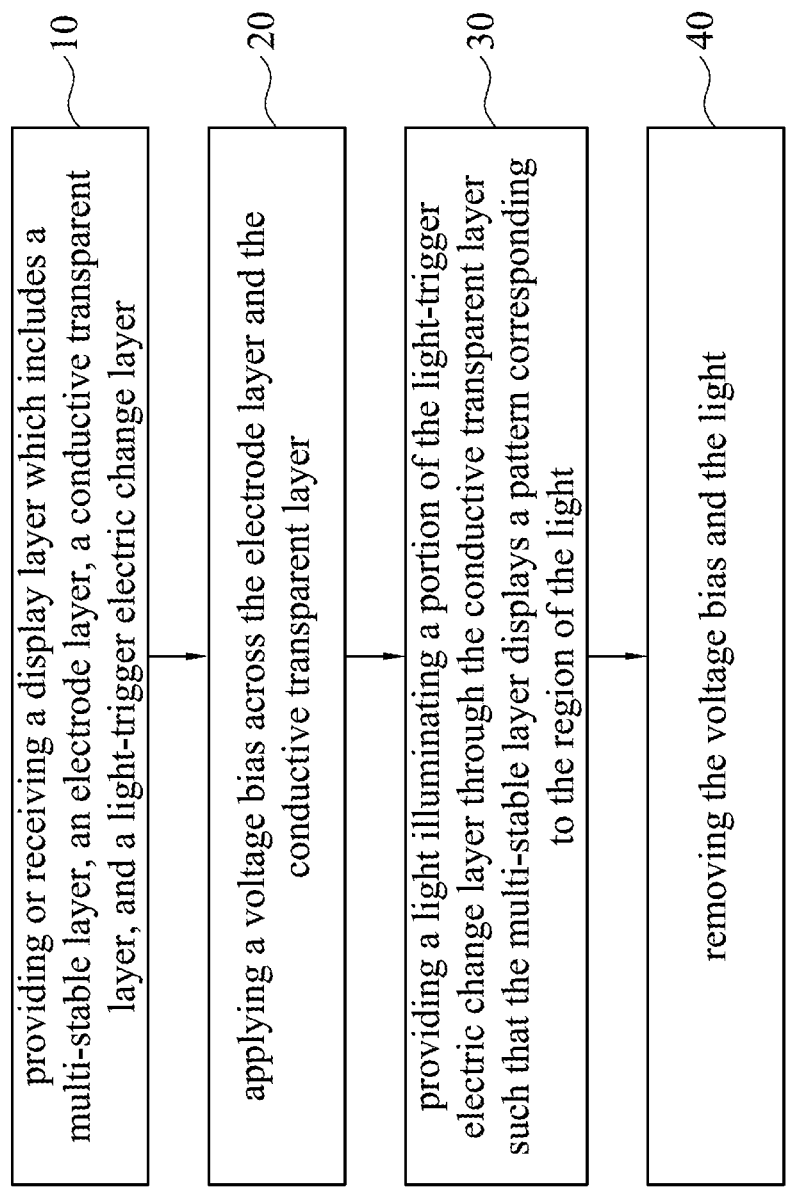
FIGS. 1A and 1B are follow charts illustrating methods for manufacturing an identifiable element according to various embodiments of the present disclosure.

The following disclosure provides many different embodiments for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1A is a follow chart illustrating a method 1 for manufacturing an identifiable element. The method 1 includes operation 10, operation 20, and operation 30. FIGS. 2A to 8 are cross-sectional views schematically illustrating the method for manufacturing the identifiable element in various process stages according to some embodiments of the present disclosure.

Referring to FIG. 1A and FIG. 2A, FIG. 2A is a cross-sectional view schematically illustrating a display layer according to some embodiments of the present disclosure. In operation 10, a display layer 100 is provided or received. The display layer 100 includes a bistable layer 110, an electrode layer 120, a conductive transparent layer 130, and a light-trigger electric change layer 140.

The bistable layer 110 is capable of exhibiting different display statuses, depending upon the intensity of an electric field applied thereto, and therefore the bistable layer is also referred to as multi-stable layer. The bistable layer 110, for example, may be an electrophoretic layer including microcapsule electrophoretic display units and/or microcup electrophoresis units. The electrode layer 120 and the conductive transparent layer 130 are disposed at opposite sides of the bistable layer 110. The electrode layer 120 may include a metallic material such as aluminum, neodymium, nickel, copper, and/or silver. Alternatively, the electrode layer 120 may include a transparent conductive material such as indium tin oxide (ITO), indium oxide, zinc oxide and/or indium zinc oxide. In addition, the electrode layer 120 may include conductive polymer.

The conductive transparent layer 130 includes conductive material, and is transparent to light within a wavelength range. In one embodiment, the conductive transparent layer 130 allows light within the wavelength range of visible light (380 nm to 780 nm) to transmit. In another embodiment, the conductive transparent layer 130 allows light within the ultraviolet wavelength range (e.g., 100 nm-380 nm, or less than 100 nm) to transmit. In still another embodiment, the conductive transparent layer 130 allows light within the wavelength range of infrared light (e.g., 780 nm-3000 nm, or greater than 3000 nm) to transmit. In various embodiments, the transmittance of the conductive transparent layer 130 for a certain light within the aforementioned wavelength ranges is greater than 50%, such as about 55%, 60%, 70%, 80%, 90%, or 95%, or more. The conductive transparent layer 130 may include a transparent conductive material such as indium tin oxide, zinc oxide, indium oxide, and/or indium zinc oxide. In some embodiments, the conductive transparent layer 130 includes a plurality of high-refractive-index layers and a plurality of low-refractive-index layers, the high-refractive-index layers and the low-refractive-index layers are alternately stacked to form a Bragg film. Light within a certain wavelength range may transmit through the Bragg film, but light within another wavelength range is reflected. The thicknesses and the number of layers of the high-refractive-index layers and low-refractive-index layers in the Bragg film can be managed to achieve the transmittance requirements in different wavelength ranges according to the actual requirements.

The light-trigger electric change layer 140 is disposed between the bistable layer 110 and the conductive transparent layer 130, and the electrical characteristics thereof may be changed when light (e.g., visible light, ultraviolet light, and/or infrared light) illuminates the light-trigger electric change layer 140. In some embodiments, when light illuminates the light-trigger electric change layer 140, the conductivity of the illustrated portion of the light-trigger electric change layer 140 is increased or the electrical resistance of the illustrated portion of the light-trigger electric change layer 140 is decreased. However, in yet some embodiments, when light illuminates the light-trigger electric change layer 140, the electrical resistance of the illustrated portion of the light-trigger electric change layer 140 is increased.

The light-trigger electric change layer 140 may be a single-layered structure or a multiple-layered structure. In some embodiments, the light-trigger electric change layer 140 includes a Schottky barrier. For example, the light-trigger electric change layer 140 may include a Schottky barrier generation layer 144 and a semiconductor layer 146. The Schottky barrier generation layer 144 is in contact with the semiconductor layer 146, and a Schottky barrier is formed on the contact surface (i.e., interfacial surface). In other words, the Schottky barrier generation layer 144 and the semiconductor layer 146 collectively form a Schottky diode. When light irradiates the semiconductor layer 146 and/or the Schottky barrier generation layer 144, the light facilitates the carriers therein to step across the Schottky barrier, so that the conductive characteristic of the light-trigger electric change layer 140 may be changed. In some examples, the Schottky barrier generation layer 144 is made of transparent conductive material, such as indium tin oxide, zinc oxide, indium oxide, and/or indium zinc oxide. While the Schottky barrier generation layer 144 is made of transparent conductive material, light may transmit through the Schottky barrier generation layer 144, and therefore the application of the present invention becomes more diverse, as will be described in more detail below. In other examples, the Schottky barrier generation layer 144 may be made of metal or metal silicide. Illustrative examples of the metal include molybdenum, platinum, chromium and/or tungsten, and illustrative examples of the metal silicide include palladium silicide and/or platinum silicide. The semiconductor layer 146 may be, for example, n-type silicon, p-type silicon, or other suitable material. In addition, the thicknesses of the Schottky barrier generation layer 144 and the semiconductor layer 146 may be designed depending on actual requirements, for example, from about several nanometers to about several tens of micrometers.

Figure 2B:
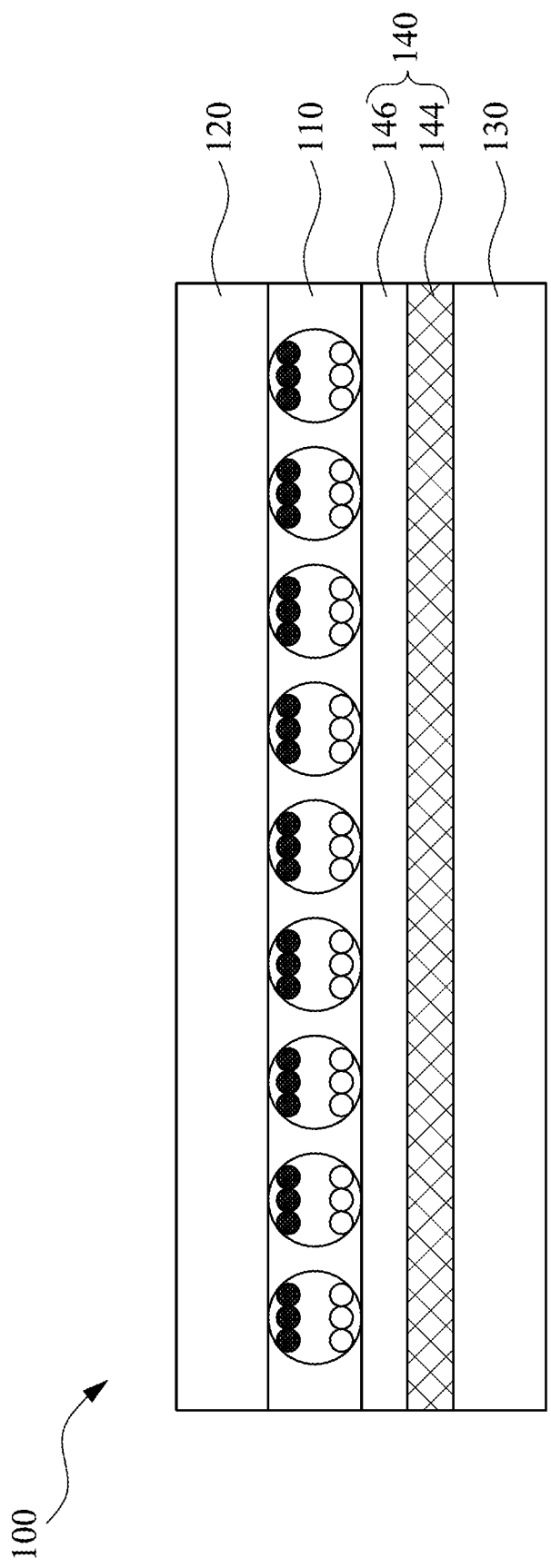

In some examples, the Schottky barrier generation layer 144 is interposed between the bistable layer 110 and the semiconductor layer 146, and the semiconductor layer 146 is interposed between the Schottky barrier generation layer 144 and the conductive transparent layer 130, as illustrated in FIG. 2A. In yet some examples, with reference to FIG. 2B, the Schottky barrier generation layer 144 is interposed between the semiconductor layer 146 and the conductive transparent layer 130, and the semiconductor layer 146 is interposed between the bistable layer 110 and the Schottky barrier generation layer 144. As described above, when the Schottky barrier generation layer 144 is made of transparent conductive material, it is applicable to both embodiments shown in FIGS. 2A and 2B.

In yet some embodiments, the light-trigger electric change layer 140 includes photosensitive conductive material. The photosensitive conductive material, for example, may be a composite material including poly (vinylidene fluoride-trifluoroethylene) and titanium oxide phthalocyanine. When light irradiates to the photosensitive conductive material, the photosensitive conductive material may have different conductivities, depending on the light intensity. In other embodiments, the light-trigger electric change layer 140 may include photoconductive polymeric material.

In yet some embodiments, when light irradiates the light-trigger electric change layer 140, the electrical resistance of the irradiated portion is increased. In one example, the light-trigger electric change layer 140 includes a conductive polymer and a negative photoresist capable of undergoing a crosslinking reaction after the irradiation of light with a certain wavelength. When the crosslinking reaction occurs in the negative-type photoresist, the electrical conductivity of the conductive polymer in light-trigger electric change layer 140 is decreased or hindered, and the electrical resistance of the irradiated portion of the light-trigger electric change layer 140 is increased. In some embodiments, the weight ratio of the negative resist to the conductive polymer ranges from about 0.2 to about 1, for example about 0.25, 0.3, 0.4, 0.5, or 0.8.

In other embodiments, the light-trigger electric change layer 140 may include a photodiode structure layer, which will be described in more detail below in connection with FIGS. 10 to 17.

Figure 3:
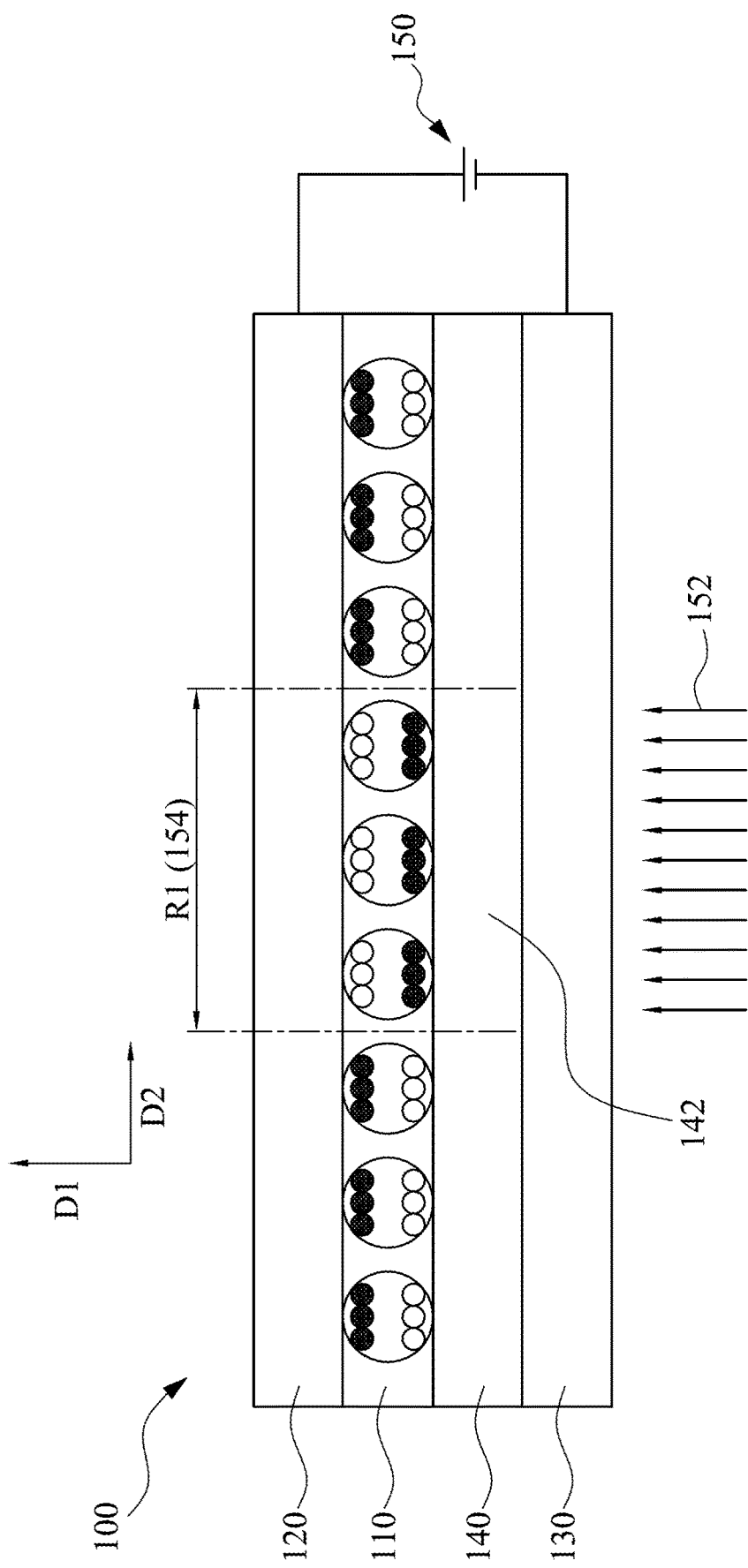
FIGS. 3 to 9 are cross-sectional views schematically illustrating a method for manufacturing the identifiable element in various process stages according to some embodiments of the present disclosure.

With reference to FIGS. 1A and 3, in operation 20, a voltage bias 150 is applied across the electrode layer 120 and the conductive transparent layer 130. In one embodiment, by connecting two electrodes of a DC power supply respectively to the electrode layer 120 and the conductive transparent layer 130, the voltage bias 150 therefore is created across the electrode layer 120 and the conductive transparent layer 130. In some embodiments, the voltage bias 150 is greater than the minimal bias capable of changing the display status of the bistable layer 110, and the applied voltage bias 150 let the bistable layer 110 display a gray corresponding to the voltage bias. However, in other embodiments, the voltage bias 150 may be less than the minimal bias which is capable of changing the display status of the bistable layer 110.

Subsequently, in operation 30, a light 152 is provided to irradiate a portion 142 of the light-trigger electric change layer 140 through the conductive transparent layer 130, such that the bistable layer shows a display pattern which corresponds to the region of light. When light irradiates the light-trigger electric change layer 140, the electric characteristics of the irradiated portion 142 thereof is changed, resulting in that the electrical field of the region R1 of the bistable layer 110 corresponding to irradiated portion 142 is changed as well, so that the display status of the region R1 of the bistable layer 110 is changed. Therefore, the display pattern 154 is formed on or in the bistable layer 110. The display pattern 154 of the bistable layer 110 substantially corresponds to the region irradiated with light, and therefore the display pattern of the bistable layer 110 may be managed by controlling or managing the pattern of the irradiated region with light 152. Specifically, if the conductivity of the irradiated portion 142 of the light-trigger electric change layer 140 increases, the electrical field across the opposite sides of the region R1 of the bistable layer 110 is increased, thereby changing the display status of the region R1 of the bistable layer 110. In contrast, if the electrical resistance of the irradiated portion 142 of the light-trigger electric change layer 140 increases, the electrical field across the opposite sides of the region R1 of the bistable layer 110 is decreased, thereby changing the display status of the region R1 of the bistable layer 110 as well. In addition, various apparatus or approaches for providing light 152 may be arranged, depending upon diverse applications. For example, the light 152 may be collimated visible light, collimated ultraviolet light, or collimated infrared light. The wavelength of the light 152 depends on the wavelength range which introduces an electrical change to the light-trigger electric change layer 140. Alternatively, a patterned mask may be provided between the conductive transparent layer 130 and a light source, and generates a light with a particular pattern by the transparent portion of the patterned mask. After operation 30, the bistable layer 110 may show a display pattern 154 substantially corresponding to the light 152.

It is noted that the conductive transparent layer 130 is not corresponding to the pixel or sub-pixel regions of a conventional display device according to various embodiments of the present disclosure. The conductive transparent layer 130 continuously extends at least a distance or region which is recognized by human naked eyes, and such distance or region is greater than the length or area of the pixel region (or sub-pixel region) of the conventional display device. Specifically, the bistable layer 110 has a thickness D1 and an extending direction D2, which is substantially perpendicular to the thickness D1. The conductive transparent layer 130 is continuously extended in the extending direction D2 a pre-determined length or a pre-determined region, and the size of such pre-determined length or pre-determined region is at least a length or an area which is capable of being recognized by human naked eyes. For example, the extending length is at least greater than 1 mm, such as 5 mm, 10 mm, 50 mm, 100 mm, 200 mm, or more. In addition, the light-trigger electric change layer 140 also continuously extends in the extending direction D2 a length which is capable of being recognized by human naked eyes, for example, 1 mm, 5 mm, 10 mm, 50 mm, 100 mm, 200 mm or more.

According to some embodiments of the present disclosure, the combination of the continuously extended conductive transparent layer 130 and light-trigger electric change layer 140 provides extremely advantageous technical effects. In conventional display devices, a plurality of pre-determined pixels or sub-pixels are arranged therein. However, in some embodiments of the present disclosure, there is no predetermined pixels or sub-pixels, and therefore photolithographic processes and etching process are not required in the manufacturing procedure, and therefore the techniques disclosed herein is a cost-effective and environmentally friendly technology. Furthermore, gate driving ICs, data driving ICs, and flexible circuit boards are not required, therefore saving material cost and manufacturing cost according to some embodiments of the present disclosure.

Figure 1B:
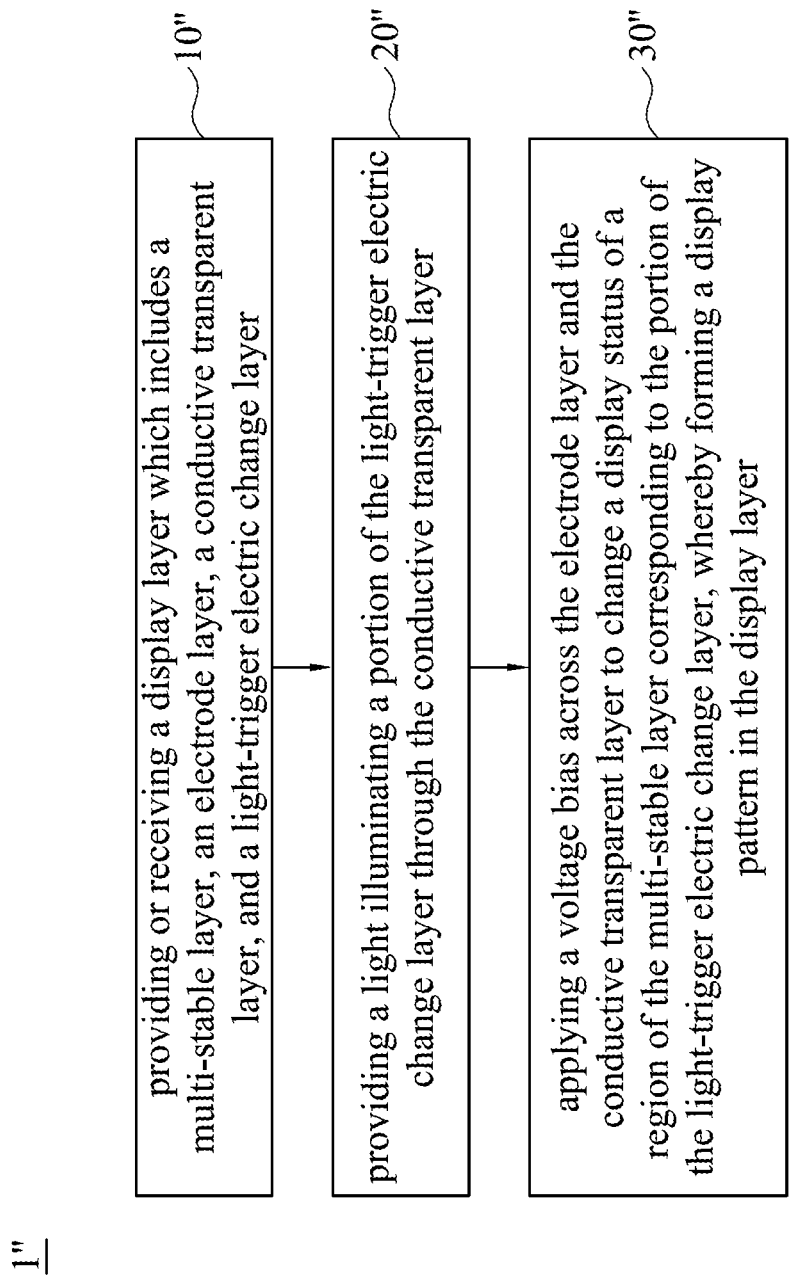

According to some embodiments of the present disclosure, in the method 1, the operation 20 and the operation 30 may be concurrently carried out or the operation 30 may be performed prior to the operation 20. Referring to FIG. 1B, illustrated is a flowchart showing a method 1" of manufacturing an identifiable element according to yet some embodiments of the present disclosure. The method 1" includes operation 10", operation 20" and operation 30". In the operation 10", a display layer is provided or received, the display layer including a bistable layer, an electrode layer, a conductive transparent layer and a light-trigger electric change layer. In the operation 20", a light is provided to irradiate a portion of light-trigger electric change layer through the conductive transparent layer. In the operation 30", a voltage bias is applied across the electrode layer and the conductive transparent layer to change a display status of a region of the bistable layer corresponding to the irradiated portion of the light-trigger electric change layer, thereby forming a display pattern in the display layer.

According to various embodiments disclosed hereinbefore, another aspect of the present disclosure is to provide a method of forming a display pattern. The method includes the following steps: (a) providing or receiving a display layer, in which the display layer includes a bistable layer, a conductive transparent layer, an electrode layer and a light-trigger electric change layer disposed between the bistable layer and the conductive transparent layer, and the electrode layer and the conductive transparent layer are disposed at opposite sides of the bistable layer; and (b) providing a voltage bias across the electrode layer and the conductive transparent layer, and allowing a light to illuminate a portion of the light-trigger electric change layer through the conductive transparent layer, such that a display status of a region of the bistable layer corresponding to the irradiated portion of the light-trigger electric change layer is changed, thereby forming a display pattern in the display layer. In step (b), said providing the voltage bias and said allowing the light to illuminate the portion of the light-trigger electric change layer may be carried out by different three sequences below: (1) concurrent; (2) providing the voltage bias first, and thereafter allowing the light to illuminate the portion of the light-trigger electric change layer; and (3) firstly allowing the light to illuminate the portion of the light-trigger electric change layer, and thereafter providing the voltage bias.

Figure 4:
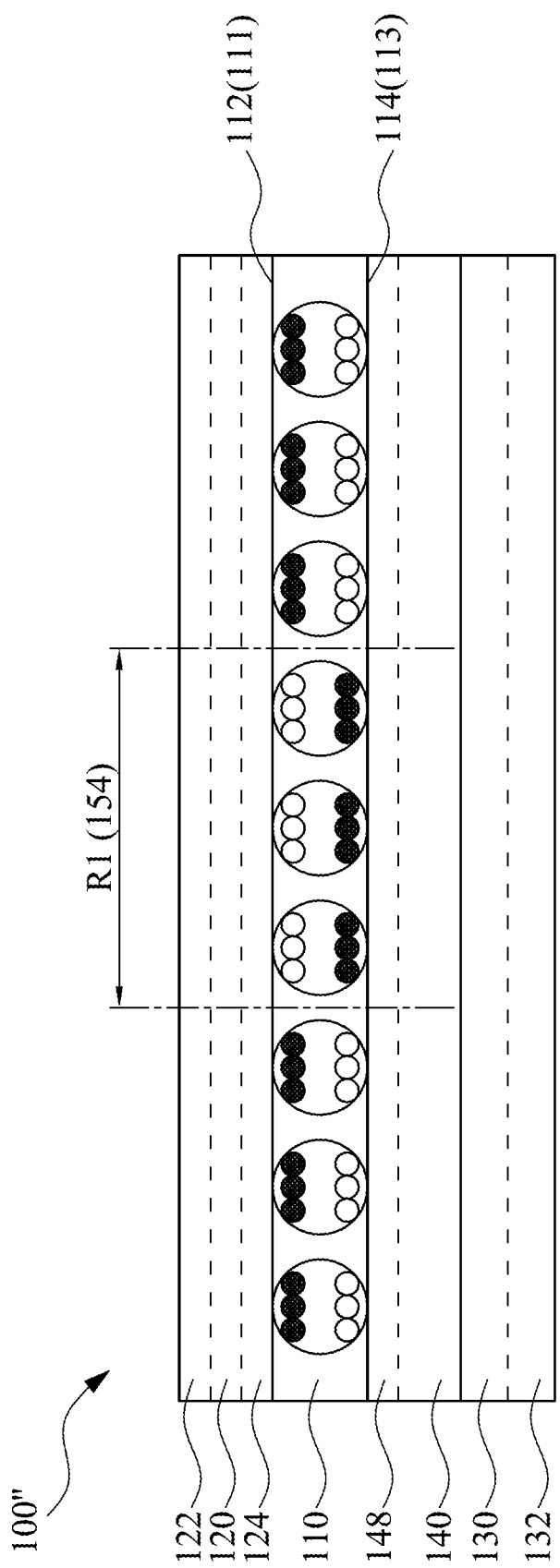

After the operation 30, method 1 and method 1" may optionally proceed to operation 40 shown in FIG. 1A. Referring to FIG. 4, the voltage bias 150 and light 152 are removed, thereby forming a display pattern 154 of the identifiable element 100". Because the display effect of the bistable layer 110 has continuous duration, the identifiable element 100" still shows the display pattern 154 after the removal of the voltage bias at opposite sides of the bistable layer 110.

Figure 5:
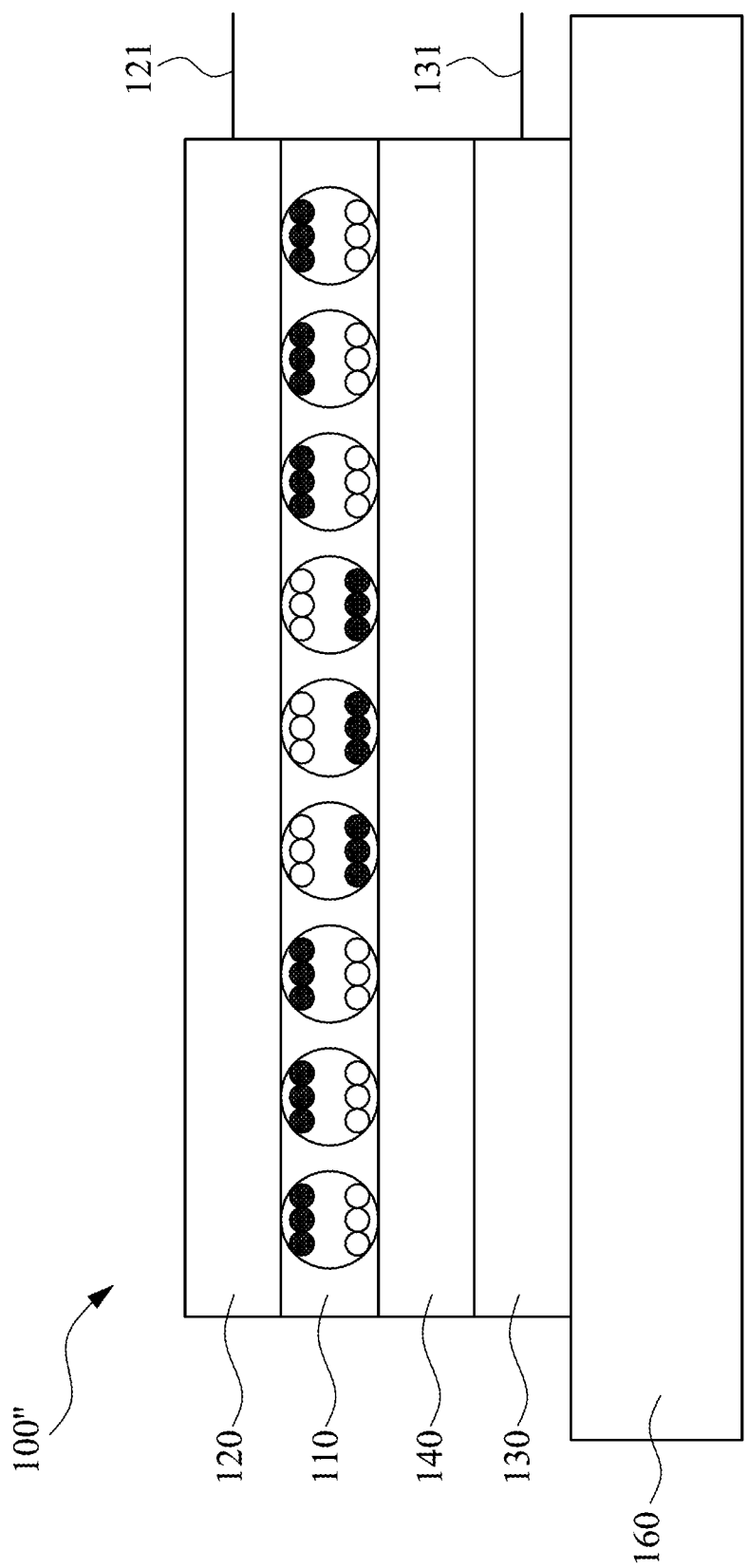

According to various embodiments of the present disclosure, other operations or steps may be performed after the operation 40. In some embodiments, after the operation 40 is carried put, the identifiable element 100" having the display pattern 154 is fixed to a carrier 160, as shown in FIG. 5. The carrier 160 may be any object or precursor substrate which needs an identifiable pattern or logo, for example shells of electronics, label plates, suitcases, keypads on the keyboards, shells of cars, etc. In one embodiment, the electrode layer 120 is made of transparent conductive material, so that the display pattern 154 may be observed through the electrode layer 120.

In some applications, the display pattern 154 of the identifiable element 100" probably needs to be changed, and the embodiments of the present disclosure may fit this requirement. In one embodiment, the identifiable element 100" includes two conductive wires 121, 131 respectively electrically connected to the electrode layer 120 and the conductive transparent layer 130. In addition, the carrier 160 is made of transparent material. When users need to change the display pattern 154, a voltage bias may be applied across the electrode layer 120 and the conductive transparent layer 130 through the conductive wires 121, 131, and then a light with a new pattern (generated by a suitable light source) may be employed to irradiate the light-trigger electric change layer 140 from the side of the carrier 160, so that the identifiable element 100" may show a new pattern. The detailed operational steps may be the same as these described hereinbefore in connection with the operation 20, the operation 30, and the operation 40.

It is noted that although the carrier 160 depicted in FIG. 5 is disposed at the side of the conductive transparent layer 130, it will be understood by those of ordinary skill in the art to which the present invention pertains that the carrier 160 may be disposed at the side of the electrode layer 120. In some embodiments, the carrier 160 is disposed on the side of the electrode layer 120, and the light-trigger electric change layer 140 is made of material transparent to visible light, such that the display pattern of the identifiable element 100" may be observed through the light-trigger electric change layer 140 and the conductive transparent layer 130.

In other embodiments, the electrical conductive characteristics of light-trigger electric change layer 140 may be changed when being irradiated by visible light. For instance, the light-trigger electric change layer 140 may include a Schottky diode comprised of the transparent conductive material and the semiconductor layer described hereinbefore. In this embodiments, when a suitable voltage bias is applied across the electrode layer 120 and the conductive transparent layer 130, the identifiable element 100" may receive the irradiation of the visible light intentionally provided (or ambient light unintentionally provided) and may show corresponding display patterns.

Figure 6:
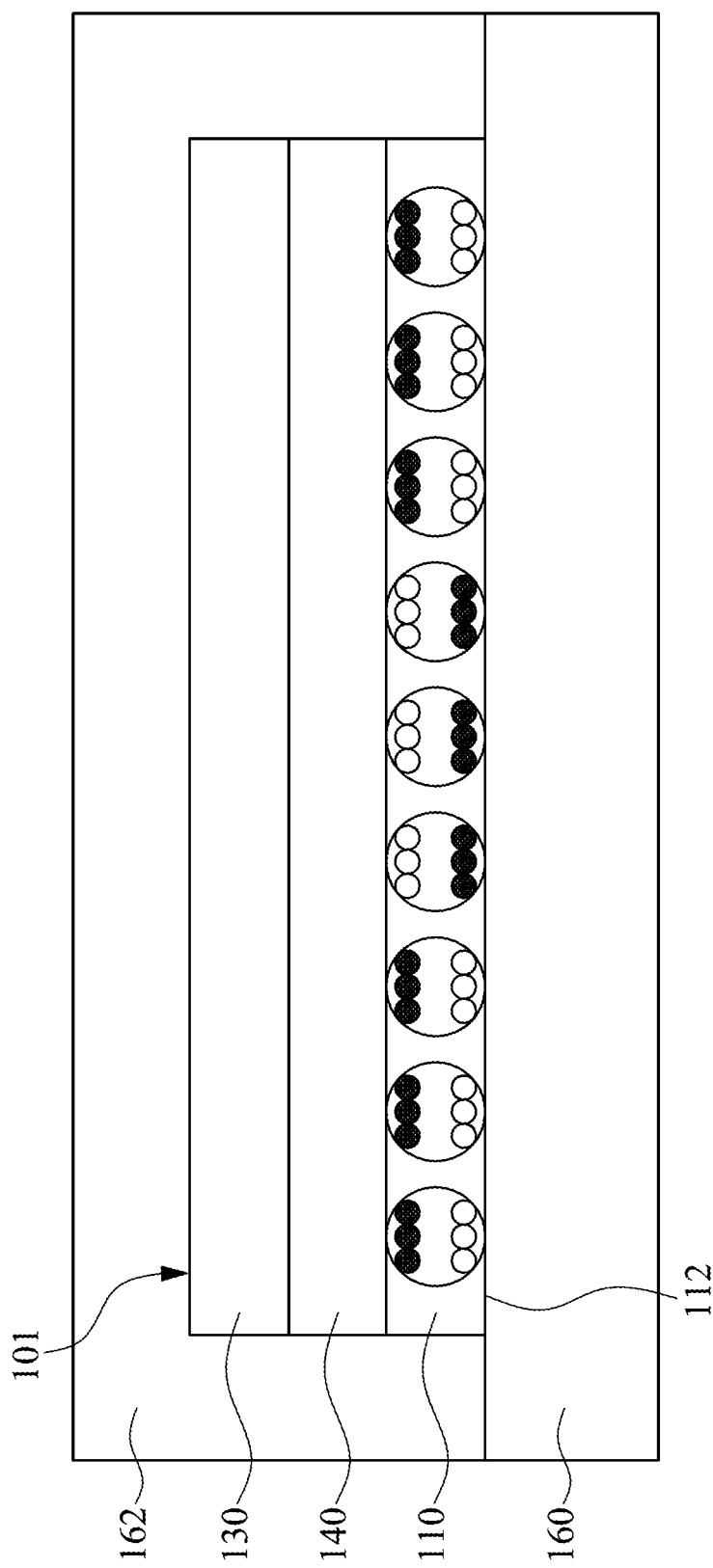

In some embodiments, after performing the operation 40, the steps described below may be carried out. Referring to FIGS. 4 and 6 simultaneously, the electrode layer 120 of the identifiable element 100" depicted in FIG. 4 is removed so that a surface 112 of the bistable layer 110 is exposed, thus forming a first identifiable element 101 (shown in FIG. 6). Thereafter, the first identifiable element 101 is fixed to the carrier 160, as shown in FIG. 6. In one embodiment, the surface 112 of the bistable layer 110 is adjacent to the carrier 160, and the carrier 160 is a transparent substrate. In some examples, referring back to FIG. 4, the identifiable element 100" a flexible substrate 122 and a releasing layer 124, the electrode layer 120 is formed on the flexible substrate 122, and the releasing layer 124 is formed on the electrode layer 120. In addition, the surface 112 of the bistable layer 110 has a first adhesive layer 111 formed thereon. The adhesive force between the releasing layer 124 and the first adhesive layer 111 is less than the adhesion between two adjacent ones of the other layers, and therefore the flexible substrate 122, the electrode layer 120 and the releasing layer 124 may be peeled off and removed from the first adhesive layer 111 by applying an external force, so that the first identifiable element 101 is obtained. Thereafter, the first identifiable element 101 is attached to the carrier 160, and the embodiment shown in FIG. 6 is obtained. Subsequently, a protective layer 162 may be optionally formed to cover the first identifiable element 101. Although FIG. 6 depicts that the carrier 160 is disposed on the side of the bistable layer 110, the carrier 160 may be disposed on the side of the conductive transparent layer 130 according to yet some embodiments of the present disclosure.

Figure 7:
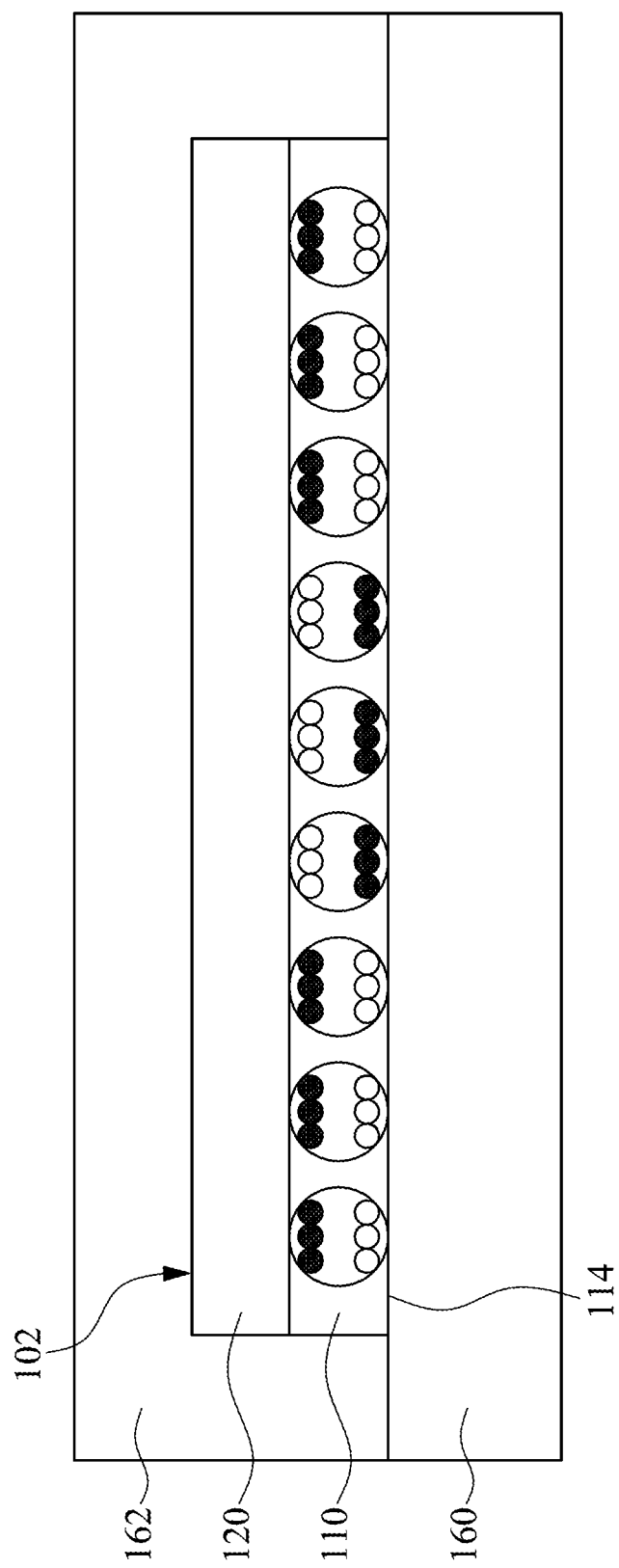

In some embodiments, after performing the operation 40, the steps described below may be performed. Referring to FIGS. 4 and 7 simultaneously, the conductive transparent layer 130 and the light-trigger electric change layer 140 of the identifiable element 100" depicted in FIG. 4 are removed to expose a surface 114 of the bistable layer 110, thereby forming a second identifiable element 102 (shown in FIG. 7). Subsequently, the second identifiable element 102 is fixed to the carrier 160, as shown in FIG. 7. In one embodiment, the surface 114 of the bistable layer 110 is attached to the carrier 160. In another embodiment, however, the electrode layer 120 may be attached onto the carrier 160. In some examples, referring back to FIG. 4, the identifiable element 100" may further include a flexible substrate 132 and releasing layer 148, in which the conductive transparent layer 130 is formed on the flexible substrate 132, and the releasing layer 148 is formed on the light-trigger electric change layer 140. In addition, the surface 114 of the bistable layer 110 has a second adhesive layer 113 formed thereon. The adhesive force between the releasing layer 148 and the second adhesive layer 113 is less than the adhesion between adjacent ones of the flexible substrate 132, the conductive transparent layer 130, the light-trigger electric change layer 140 and the releasing layer 148. Therefore, the flexible substrate 132, the conductive transparent layer 130, the light-trigger electric change layer 140 and the releasing layer 148 may be peeled off together and removed from the second adhesive layer 113 by applying an external force, so that the second identifiable element 102 is obtained. Thereafter, the second identifiable element 102 is fastened (e.g., adhered) onto the carrier 160, so that the embodiment depicted in FIG. 7 is obtained. Subsequently, a protective layer 162 may optionally be formed covering the second identifiable element 102. Although FIG. 7 depicts that the carrier 160 is disposed at the side of the bistable layer 110, the carrier 160 may be disposed at the side of the electrode layer 120.

Figure 8:
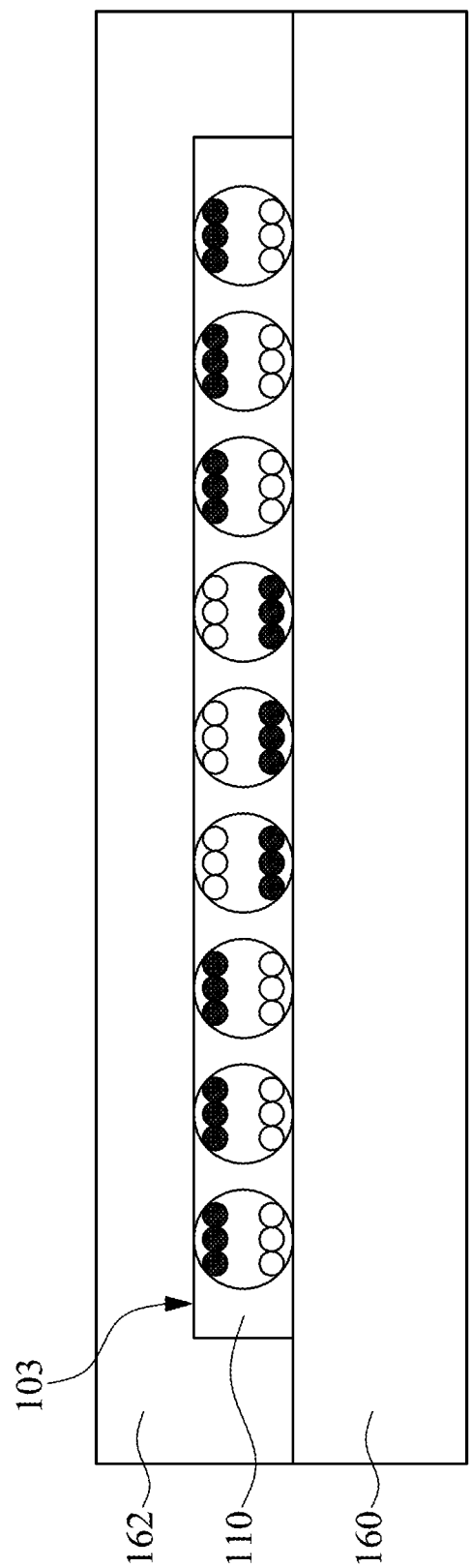

In some embodiments, after performing the operation 40, the steps described below may be performed. With reference to FIG. 4 and FIG. 8, the conductive transparent layer 130, the light-trigger electric change layer 140, and the electrode layer 120 of the identifiable element 100" are removed, such that opposite surfaces 112, 114 of the bistable layer 110 are exposed so as to form a third identifiable element 103 (depicted in FIG. 8). Then, the third identifiable element 103 is fastened onto the carrier 160. The carrier 160 may be disposed at the side of the surface 112 or the side of surface 114 of the bistable layer 110. Thereafter, a protective layer 162 may optionally be formed covering the third identifiable element 103. The protective layer 162 may be made of light transparent material, such as acrylic resin or epoxy resin. The approaches of the removal of the conductive transparent layer 130, the light-trigger electric change layer 140, and the electrode layer 120 may be the same as these described above in connection with FIG. 4, FIG. 6 and FIG. 7.

Figure 9:
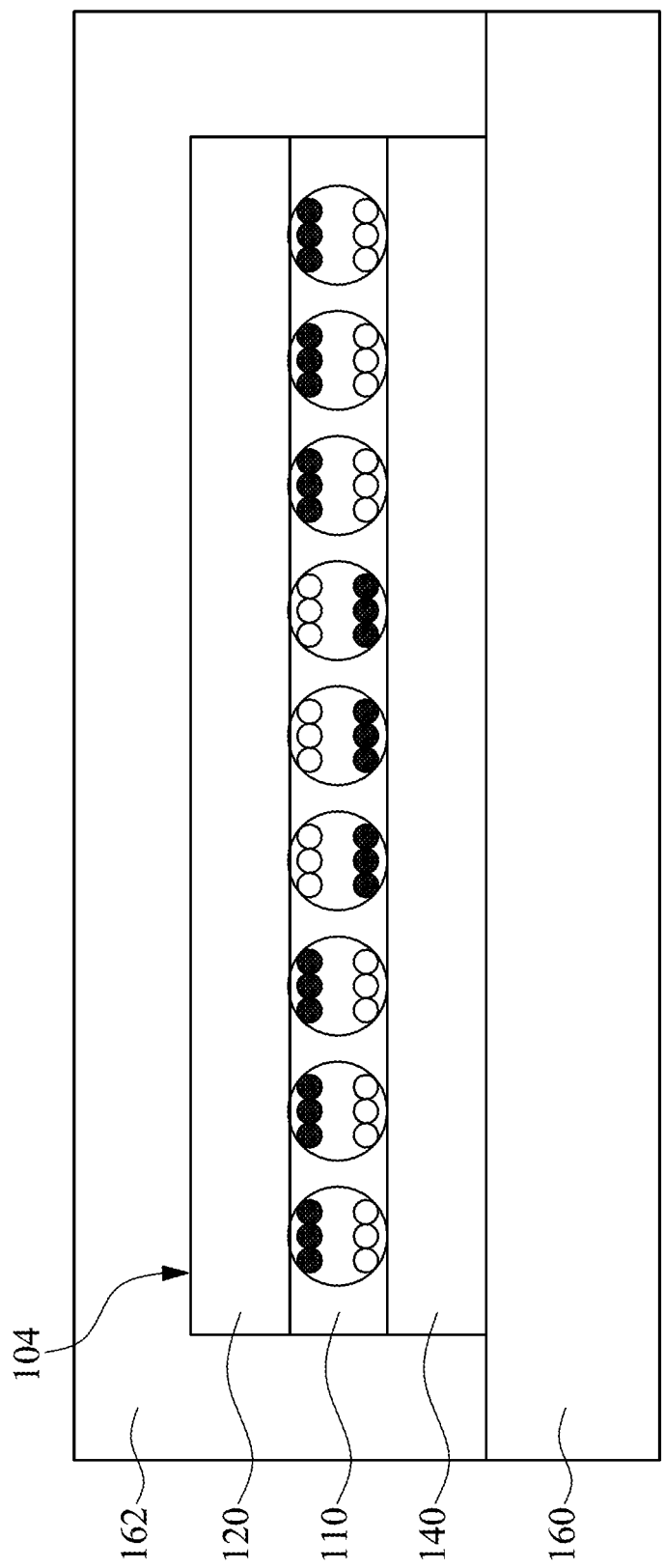

In some embodiments, after performing the operation 40, the steps described below may be performed. With reference to FIG. 4 and FIG. 9, the conductive transparent layer 130 of the identifiable element 100" is removed, thereby forming a fourth identifiable element 104 (shown in FIG. 9). For example, the identifiable element 100" may has an additional releasing layer (not shown in FIG. 4) between the conductive transparent layer 130 and the light-trigger electric change layer 140 such that the conductive transparent layer 130 may be separated from the light-trigger electric change layer 140. After removing the conductive transparent layer 130, the fourth identifiable element 104 is fastened onto the carrier 160. In some examples, a protective layer 162 may be optionally formed covering the fourth identifiable element 104. The protective layer 162 may be made of light transparent material such as acrylic resin or epoxy resin. Although FIG. 9 depicts that the carrier 160 is disposed at the side of the light-trigger electric change layer 140, the carrier 160 may be disposed at the side of the electrode layer 120.

According to another aspect of the present disclosure, an identifiable element is provided. Referring to FIG. 4, the identifiable element 100" does not include any transistor, so that the electrode layer 120 and the conductive transparent layer 130 do not electrically connected to the transistor. When light illuminates the light-trigger electric change layer 140, the electric characteristics of the light-trigger electric change layer 140 is changed. In some embodiments, when light irradiates the light-trigger electric change layer 140, the conductivity of the irradiated portion thereof is increased (i.e., the electrical resistance is decreased). But in yet some embodiments, the light irradiates the light-trigger electric change layer 140, the electrical resistance of the irradiated portion thereof is increased.

In some embodiments, the identifiable element 100" has a display pattern 154 and a region out of the display pattern 154, the presented gray of the display pattern 154 is different from the gray of the region out of the display pattern 154.

Figure 10:
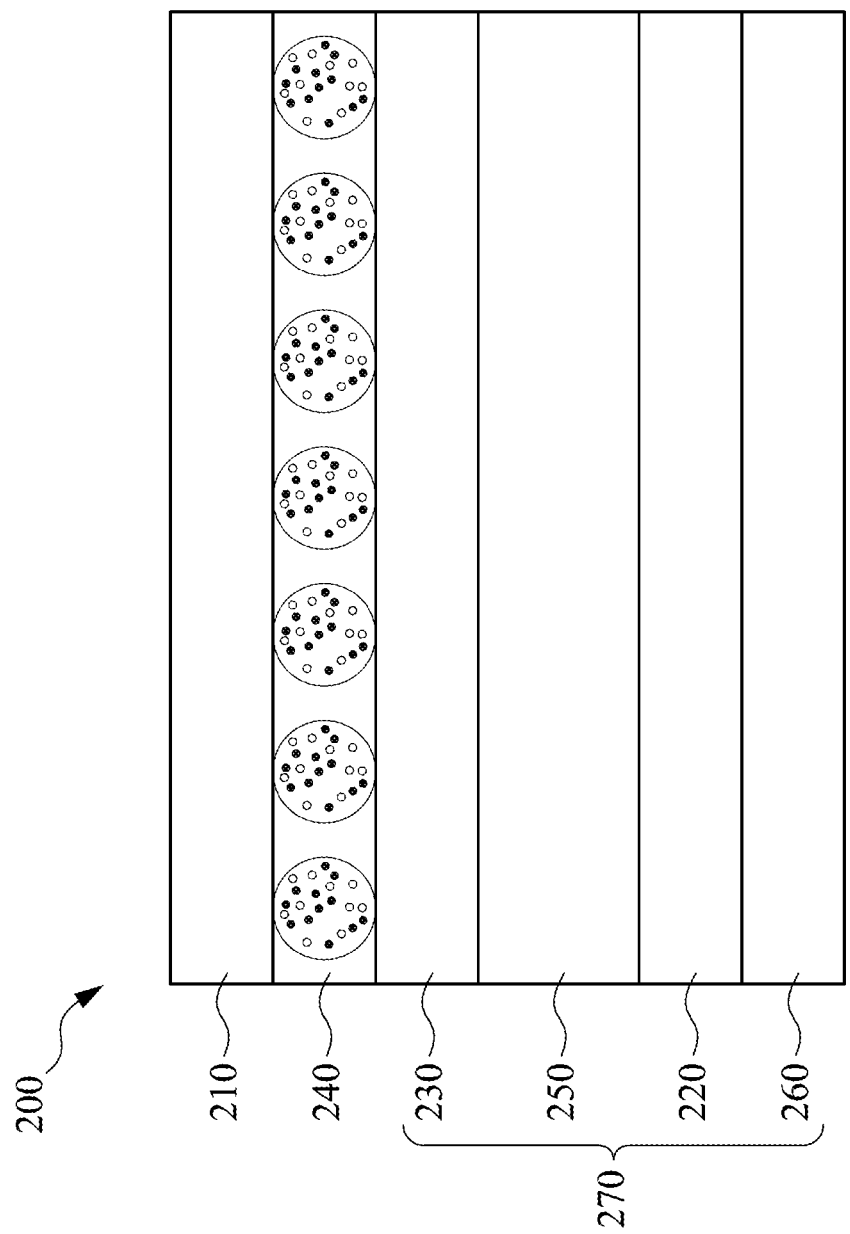
FIG. 10 is a cross-sectional view schematically illustrating a display device according to some embodiments of the present disclosure.

Another aspect of the present disclosure is to provide a display device. FIG. 10 is a cross-sectional view schematically illustrating a display device 200 according to some embodiments of the present disclosure. The display device 200 includes a first conductive transparent layer 210, a second conductive transparent layer 220, a pixel electrode layer 230, a bistable layer 240 and photodiode structure layer 250.

The first conductive transparent layer 210 is opposite to the second conductive transparent layer 220. The pixel electrode layer 230 is disposed between the first conductive transparent layer 210 and the second conductive transparent layer 220. The bistable layer 240 is disposed between the first conductive transparent layer 210 and the pixel electrode layer 230. In one embodiment, the first conductive transparent layer 210 and the pixel electrode layer 230 are respectively disposed on opposite surfaces of the bistable layer 240. The photodiode structure layer 250 is disposed between the pixel electrode layer 230 and the second conductive transparent layer 220. In other words, the pixel electrode layer 230 is disposed between the photodiode structure layer 250 and the bistable layer 240. The first conductive transparent layer 210, the second conductive transparent layer 220, and the bistable layer 240 may be the same as the conductive transparent layer and the bistable layer of any embodiment or example described hereinbefore, and the detail descriptions thereof are not repeated herein. The embodiments of the pixel electrode layer 230 and the photodiode structure layer 250 are described in detail hereinafter.

Figure 11:
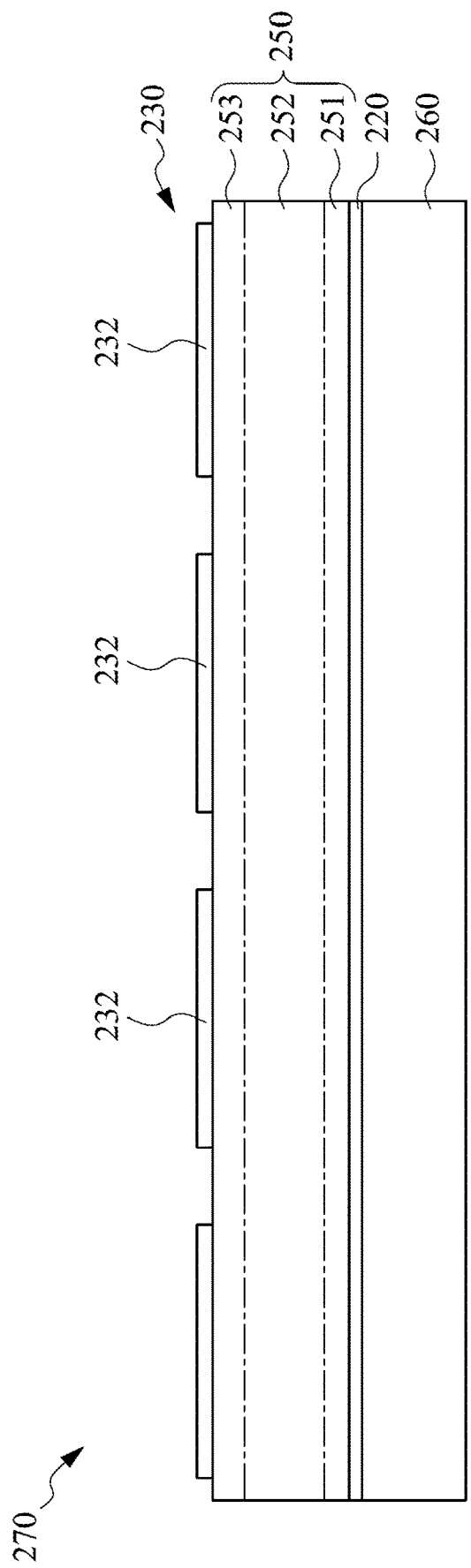
FIG. 11 is cross-sectional view schematically illustrating an intermediate structure according to some embodiments of the present disclosure.

In some embodiments, the display device 200 further includes a plate carrier 260, on which the second conductive transparent layer 220, the photodiode structure layer 250 and the pixel electrode layer 230 are sequentially disposed, thereby forming an intermediate structure 270. FIG. 11 is cross-sectional view schematically illustrating an intermediate structure 270 according to some embodiments of the present disclosure. As shown in FIG. 11, in some examples, the photodiode structure layer 250 includes a first-type semiconductor layer 251, an intrinsic semiconductor layer 252, and a second-type semiconductor layer 253, in which the intrinsic semiconductor layer 252 is disposed on the first-type semiconductor layer 251, and the second-type semiconductor layer 253 is disposed on the intrinsic semiconductor layer 252. The first-type semiconductor layer 251 may be a P-type semiconductor layer or N-type semiconductor layer, such as a P+ amorphous silicon layer or N+ amorphous silicon layer. The second-type semiconductor layer 253 may be a P-type semiconductor layer or N-type semiconductor layer, such as a P+ amorphous silicon layer or N+ amorphous silicon layer. When the first-type semiconductor layer 251 is a P-type semiconductor layer, the second-type semiconductor layer 253 is an N-type semiconductor layer. To the contrary, when the first-type semiconductor layer 251 is an N-type semiconductor layer, the second-type semiconductor layer 253 is a P-type semiconductor layer.

The pixel electrode layer 230 is disposed on the photodiode structure layer 250. In some embodiments, the pixel electrode layer 230 includes a plurality of conductive pads 232 which are discrete from each other, and each conductive pad 232 is electrically connected to the photodiode structure layer 250. In one example, the conductive pads 232 are in direct contact with the second-type semiconductor layer 253 of the photodiode structure layer 250. Therefore, the conductive pad 232 may receive the voltage signals or current signals transmitted from photodiode structure layer 250. Further, the pixel electrode layer 230 and the first conductive transparent layer 210 are respectively disposed at opposite sides of the bistable layer 240 (as shown in FIG. 10), and therefore the dimension of the conductive pad 232 of the pixel electrode layer 230 may define the resolution of the bistable layer 240. Although FIG. 11 depicts the pixel electrode layer 230 being a plurality of discrete conductive pads 232, the pixel electrode layer 230 may extend continuously over the entire display region, rather than the discrete conductive pads, according to yet some embodiments of the present disclosure.

Figure 12A:
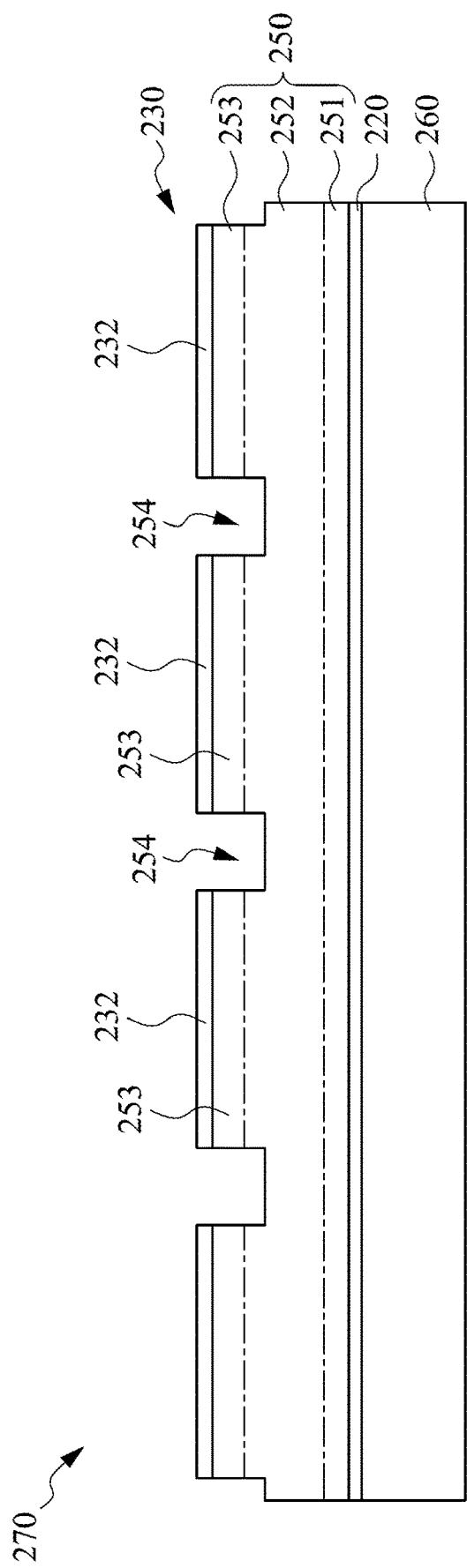
FIG. 12A depicts a cross-sectional view schematically showing an intermediate structure 270 according to another embodiment of the present disclosure.

FIG. 12A depicts a cross-sectional view schematically showing an intermediate structure 270 according to another embodiment of the present disclosure. The photodiode structure layer 250 includes a common first-type semiconductor layer 251, a common intrinsic semiconductor layer 252, and a plurality of second-type semiconductor layers 253. The common intrinsic semiconductor layer 252 is disposed on the common first-type semiconductor layer 251. The plurality of the second-type semiconductor layers 253 are disposed on the common intrinsic semiconductor layer 252. A trench 254 is present between adjacent two second-type semiconductor layers 253, and the depth of the trench 254 is greater than the thickness of each second-type semiconductor layer 253, and therefore the trench 254 can isolate electrical interference between adjacent two second-type semiconductor layers 253. Thus, each second-type semiconductor layer 253 defines a photodiode in the photodiode structure layer 250. In some examples, each conductive pad 232 is disposed on corresponding one of the second-type semiconductor layers 253. The plane contours of the conductive pads 232 are substantially the same as that of the second-type semiconductor layers 253. Because the trench 254 isolates adjacent ones of the second-type semiconductor layers 253, the leakage current of each conductive pad 232 may be effectively decreased.

Figure 12C:
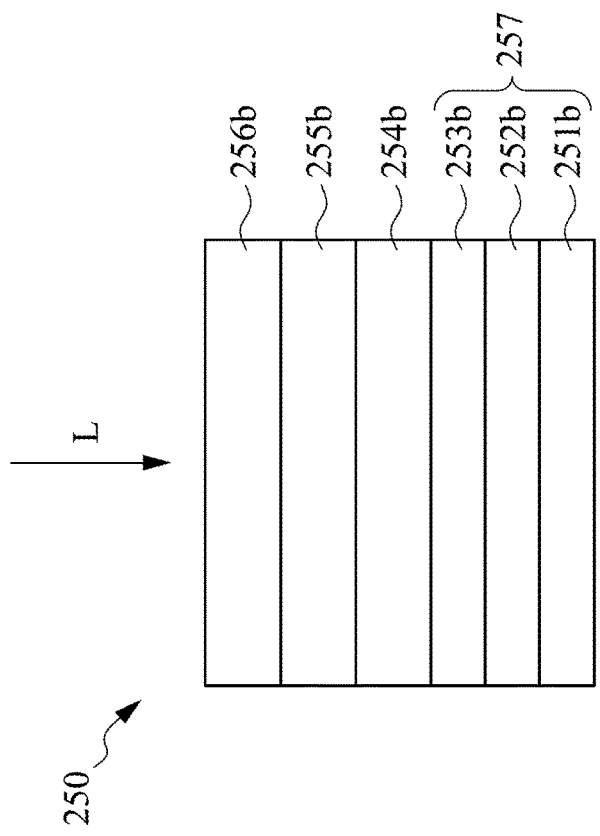
FIG. 12C is cross-sectional view schematically illustrating a photodiode structure layer according to still another embodiment of the present disclosure.
Figure 12B:
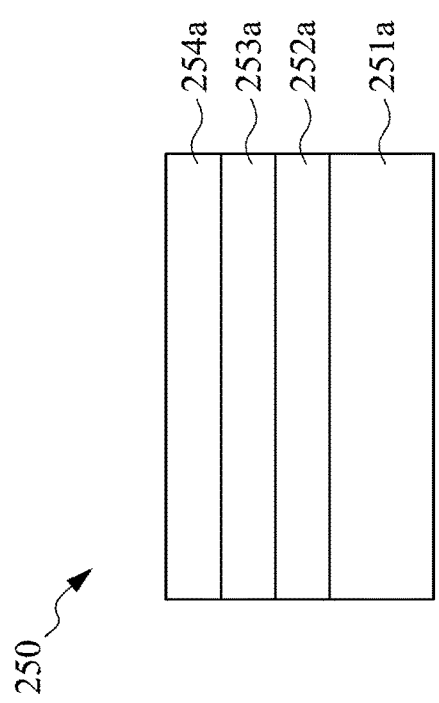
FIG. 12B is cross-sectional view schematically illustrating a photodiode structure layer according to still another embodiment of the present disclosure.

FIG. 12B is cross-sectional view schematically illustrating a photodiode structure layer 250 according to still another embodiment of the present disclosure. The photodiode structure layer 250 includes an N-type heavily doped InP substrate 251*a*, an intrinsic InP layer 252*a*, an intrinsic InGaAs absorbing layer 253*a*, and a P-type heavily doped InP layer 254*a*. The pixel electrode layer 230 may be disposed on the N-type heavily doped InP substrate 251*a* or P-type heavily doped InP layer 254*a*.

FIG. 12C is cross-sectional view schematically illustrating a photodiode structure layer 250 according to still another embodiment of the present disclosure. The photodiode structure layer 250 includes a semiconductor substrate 257, a long-wavelength absorbing layer 254b, a medium-wavelength absorbing layer 255b, and a short-wavelength absorbing layer 256b. In one example, the semiconductor substrate 257 includes an N-type heavily doped GaSb substrate 251b and P-type heavily doped GaSb buffering layer 252b. In some examples, the semiconductor substrate 257 further includes a P-type contact layer 253b configured to improve the effectiveness of electrical contact between the semiconductor substrate 257 and the long-wavelength absorbing layer 254b. In addition, the long-wavelength absorbing layer 254b, for example, is configured to absorb light with wavelength of about 600-780 nm, and the long-wavelength absorbing layer 254b includes a InAl layer and/or a GaSb layer, for instance. The medium-wavelength absorbing layer 255b, for example, is configured to absorb light with wavelength of about 480-600 nm, and the medium-wavelength absorbing layer 255b includes a InAl layer and/or a GaSb layer. The short-wavelength absorbing layer 256b, for example, is configured to absorb light with wavelength of about 380-480 nm, and the short-wavelength absorbing layer 256b includes a InAs layer, a GaSb layer, a AlSb layer, and a GaSb layer stacked in sequence, with the InAs layer or GaSb layer in contact with the medium-wavelength absorbing layer 255b. In this embodiment, Light L is transmitted into the photodiode structure layer 250 from the side of the short-wavelength absorbing layer 256b.

Figure 12D:
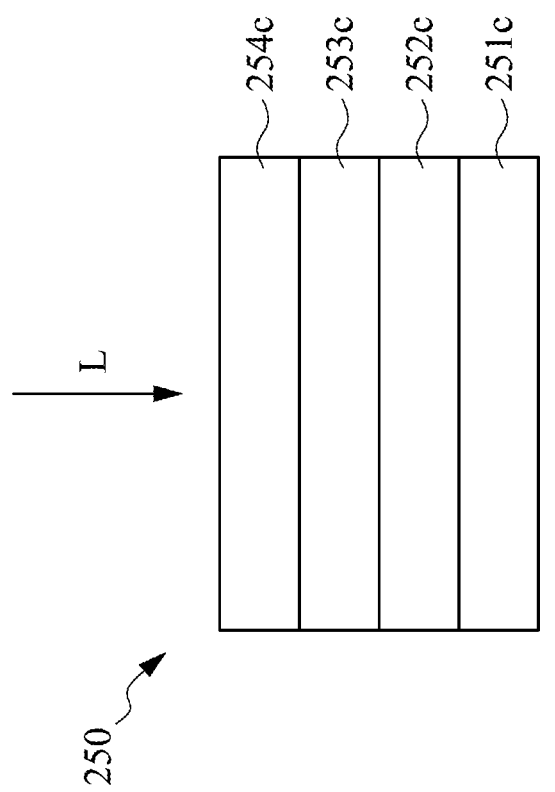
FIG. 12D is cross-sectional view schematically illustrating a photodiode structure layer according to still another embodiment of the present disclosure.

FIG. 12D is cross-sectional view schematically illustrating a photodiode structure layer 250 according to still another embodiment of the present disclosure. The photodiode structure layer 250 includes an N-type heavily doped GaAs layer 251c, an N-type lightly doped GaAs layer 252c, a P-type lightly doped GaAs layer 253c, and an N-type heavily doped AlGaAs layer 254c. The pixel electrode layer 230 may be disposed on N-type heavily doped AlGaAs layer 254c or on the N-type heavily doped GaAs layer 251c.

Figure 12E:
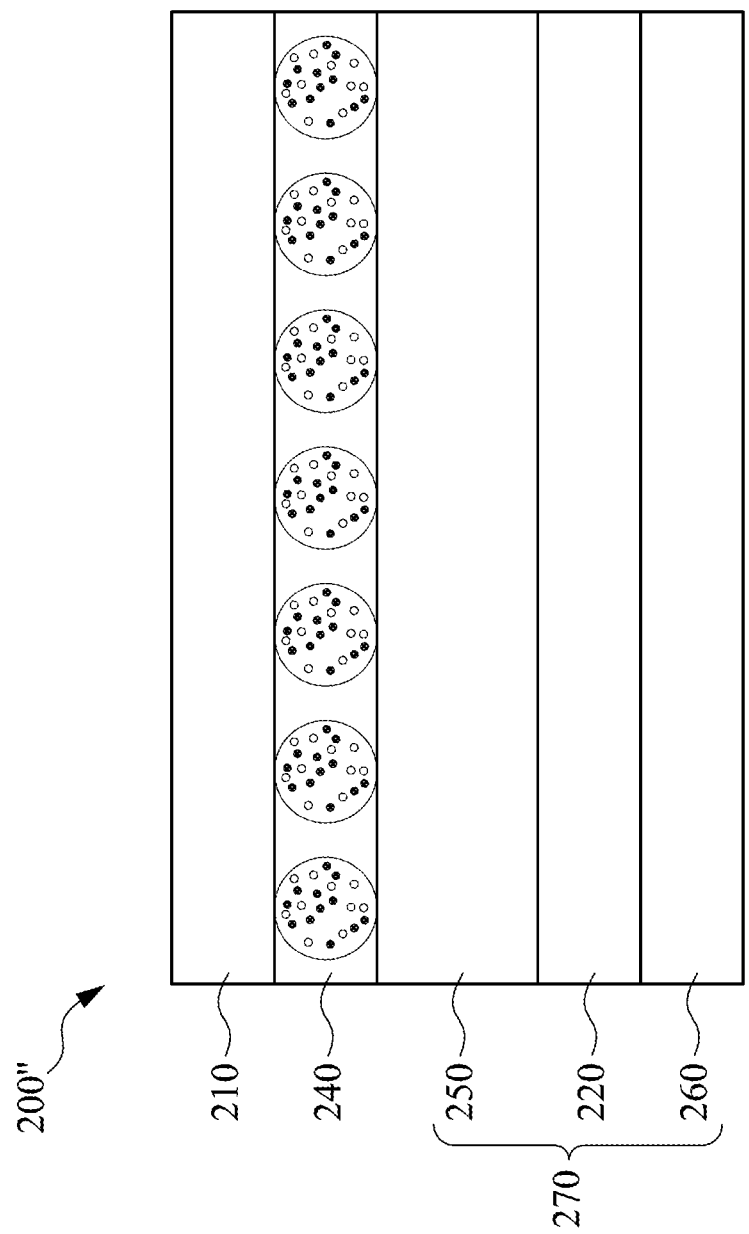
FIG. 12E is cross-sectional view schematically illustrating a display device according to still some embodiments of the present disclosure.
Figure 12F:
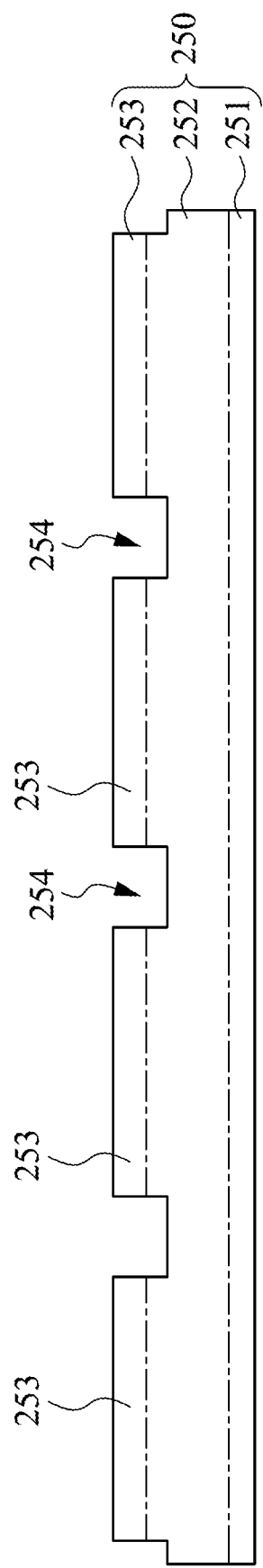
FIG. 12F depicts a cross-sectional view schematically illustrating the photodiode structure layer according to yet some embodiments of the present disclosure.

FIG. 12E is cross-sectional view schematically illustrating a display device 200" according to still some embodiments of the present disclosure. The display device 200" depicted in FIG. 12E is different from the display device 200 in FIG. 10 in that the display device 200" does not include the pixel electrode layer 230. Briefly, the bistable layer 240 depicted in FIG. 12E is disposed between the first conductive transparent layer 210 and the second conductive transparent layer 220, and the photodiode structure layer 250 is disposed between the bistable layer 240 and the second conductive transparent layer 220. Further, the photodiode structure layer 250 is electrically connected to the bistable layer 240. In one example, the bistable layer 240 is in direct contact with the photodiode structure layer 250. FIG. 12F depicts a cross-sectional view schematically illustrating the photodiode structure layer 250 according to yet some embodiments of the present disclosure. The photodiode structure layer 250 includes a common first-type semiconductor layer 251, a common intrinsic semiconductor layer 252, and a plurality of second-type semiconductor layers 253. The common intrinsic semiconductor layer 252 is disposed on the common first-type semiconductor layer 251, and the pluralities of the second-type semiconductor layers 253 are disposed on the common intrinsic semiconductor layer 252. Each trench 254 separates adjacent ones of the second-type semiconductor layers 253. The second-type semiconductor layers 253 is in direct contact with the bistable layer 240, and the second-type semiconductor layer 253 is capable of forming an excellent contact surface with the bistable layer 240, so that the display device 200" shown in FIG. 12E does not need the pixel electrode layer 230 or the conductive pad 232. According to several embodiments, the first-type semiconductor layer 251 may be a P-type or N-type semiconductor layer such as a P+ amorphous silicon layer or N+ amorphous silicon layer. The second-type semiconductor layer 253 may be a P-type or N-type semiconductor layer such as an amorphous silicon layer. When the first-type semiconductor layer 251 is a P-type semiconductor layer, the second-type semiconductor layer 253 is an N-type semiconductor layer. To the contrary, when the first-type semiconductor layer 251 is an N-type semiconductor layer, the second-type semiconductor layer 253 is a P-type semiconductor layer.

FIGS. 13A-16B are drawings schematically illustrating a method of forming the display pattern in various steps according to some embodiments of the present disclosure.

Referring to FIG. 13A, the display device 200 described in any embodiment hereinbefore is first provided. For the sake of clear expression of the method described herein, certain elements of the display device 200 in FIGS. 13A-16B are sketchily illustrated. For instance, the second conductive transparent layer 220 is shown as a line only, and the photodiode structure layer 250 is illustrated as a series of diode symbols. FIG. 13B depicts the display status presented on the display device 200. In this step, because no voltage is applied to the display device 200, the color particles of the bistable layer 240 are randomly distributed, and the display device 200 exhibits the original gray thereof.

Figure 14B:
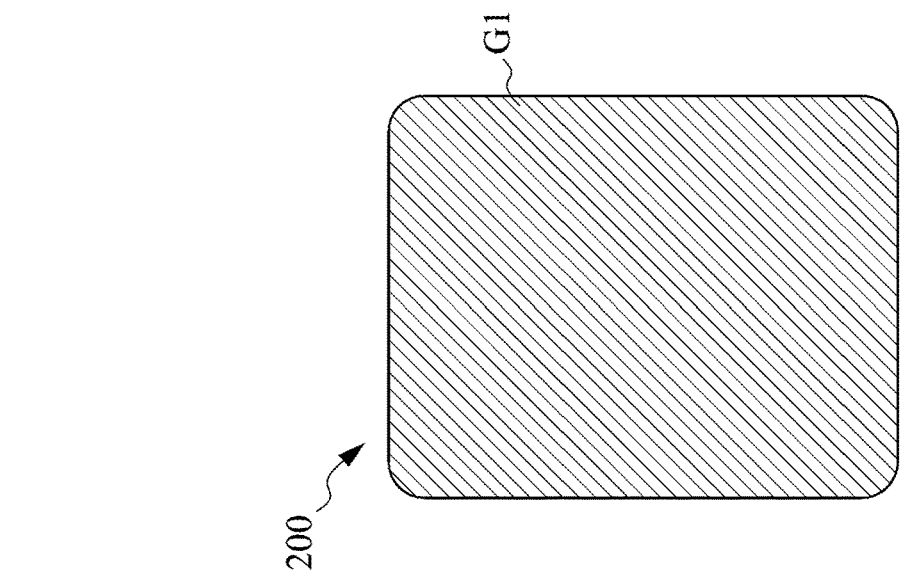
Figure 14A:
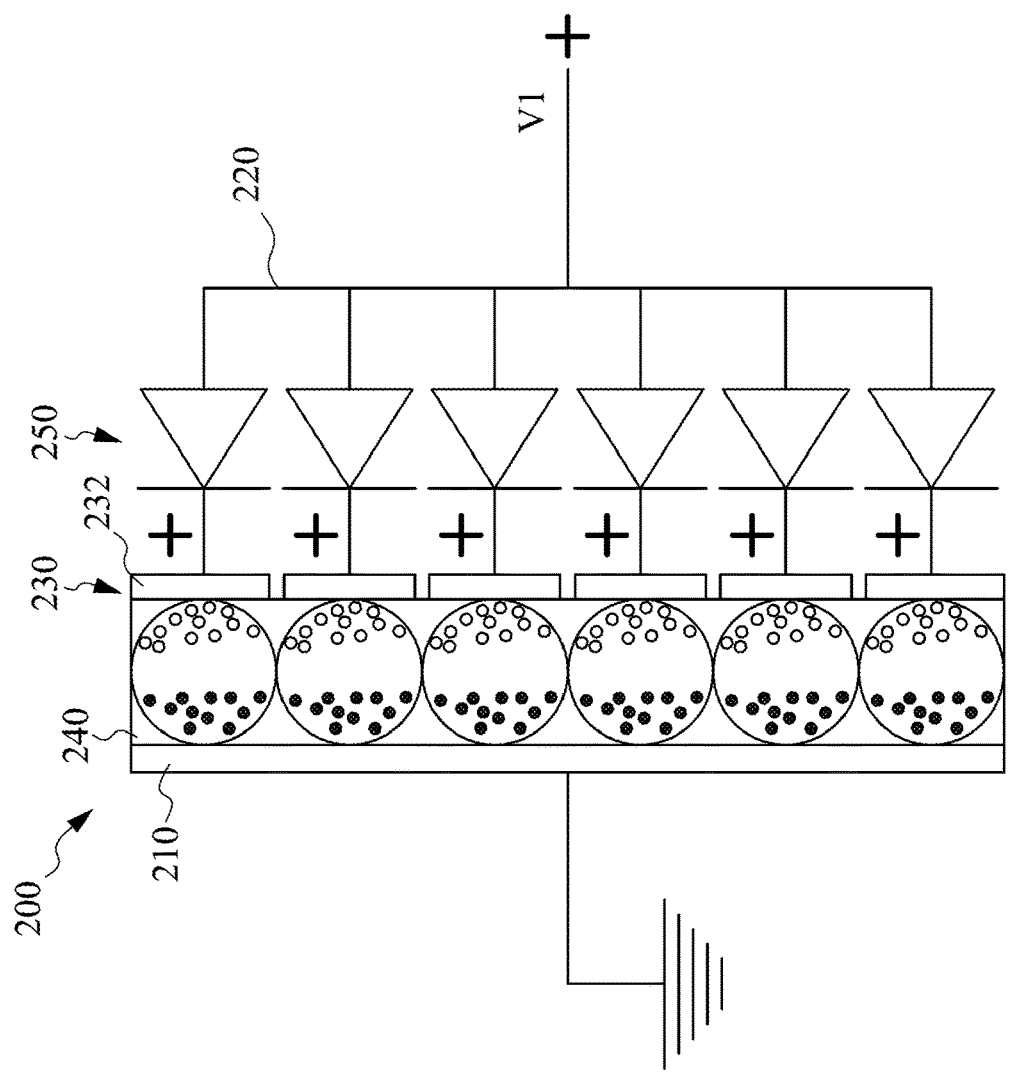

Referring to FIG. 14A, a first voltage bias V1 is applied across the first conductive transparent layer 210 and the second conductive transparent layer 220. For example, the first voltage bias V1 is a positive bias. Meanwhile, the electrical potential of the second conductive transparent layer 220 is transmitted to each conductive pad 232 of the pixel electrode layer 230 through the photodiode structure layer 250, so that each conductive pad 232 of the pixel electrode layer 230 has a positive bias. The positive bias between the pixel electrode layer 230 and the first conductive transparent layer 210 results in the movement of the charged color particles of the bistable layer 240 so that the display device 200 exhibits a first gray G1 over the entire display device 200, and the first gray G1, for example, may be a "black" display status, as illustrated in FIG. 14B.

Referring to FIG. 15A, a second voltage bias V2 is applied across the first conductive transparent layer 210 and second conductive transparent layer 220, in which the second voltage bias V2 is different from the first voltage bias V1. For example, the second voltage bias V2 is a negative voltage bias, but the first voltage bias V1 is a positive voltage bias. Because the second voltage bias V2 is a negative voltage bias, current can not transmit through the photodiode structure layer 250. Therefore, electrical potential of each conductive pad 232 of the pixel electrode layer 230 is substantially unaffected or unchanged, and the applied second voltage bias V2 can not change the display status of the bistable layer 240 so that the display device 200 still exhibits the first gray G1 over the entire display device 200, as shown in FIG. 15B. One skilled in the art to which the present invention pertains will realize that the positive voltage bias and the negative voltage bias described above are merely illustrative and, in other embodiments, the first voltage difference V1 may be a negative voltage bias, and the second voltage difference V2 may be a positive voltage bias when the forward direction of the photodiode layer 250 is opposite to that shown in FIG. 15A.

Figure 16B:
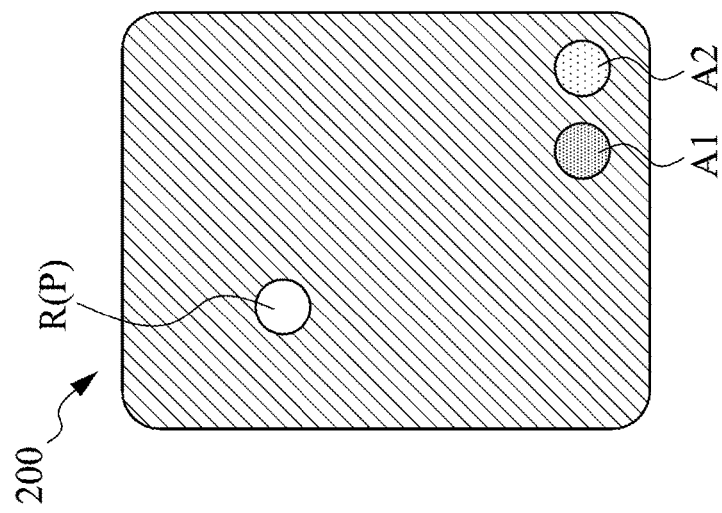
Figure 16A:
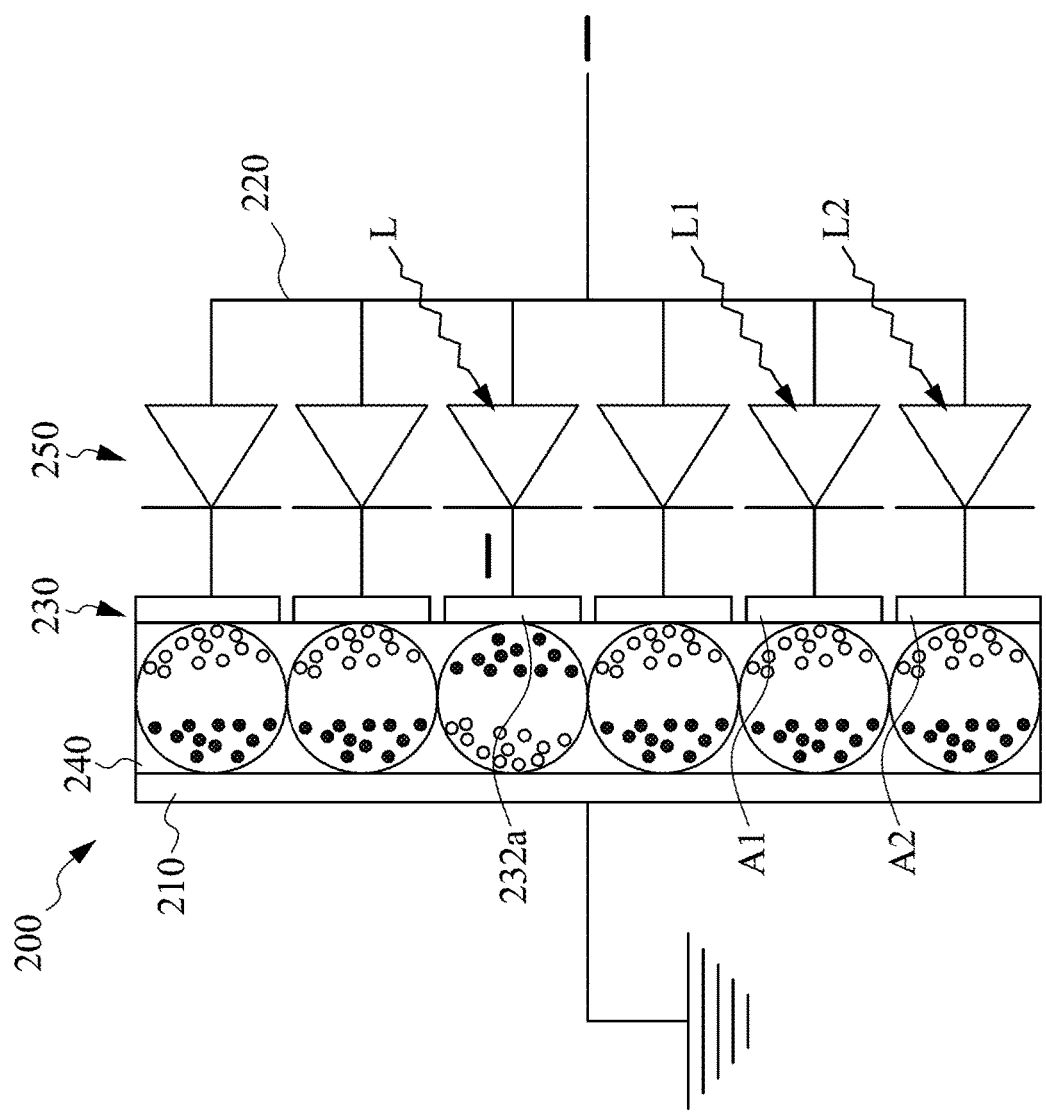
Figure 17:
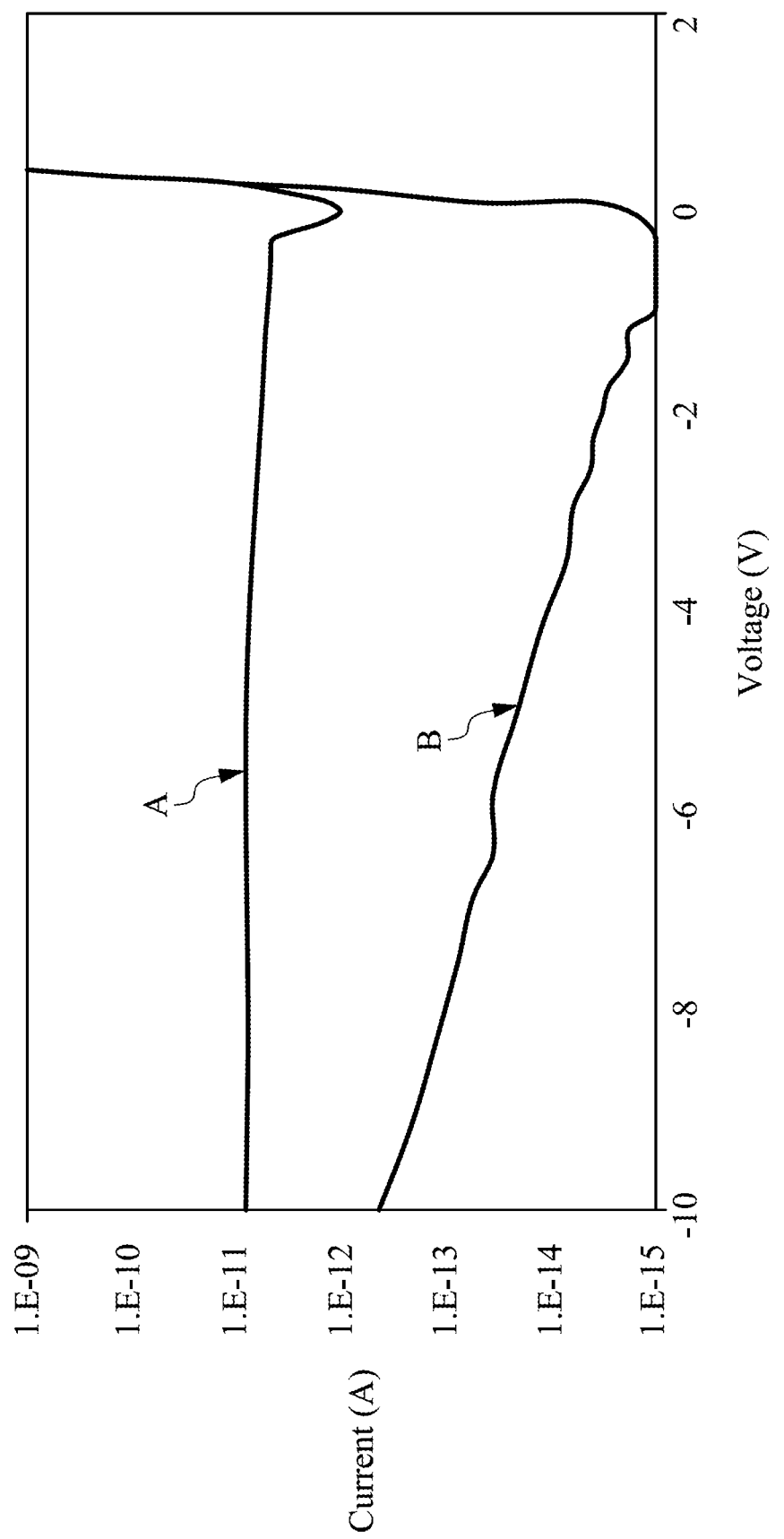
FIG. 17 depicts a Current-Voltage relationship diagram of a photodiode structure layer according to one example of the present disclosure.

With reference to FIGS. 16A and 16B, a light L is allowed to illuminate (or irradiate) a portion of the photodiode structure layer 250 through the second conductive transparent layer 220, such that the region R of the bistable layer 240 corresponding to the illuminated portion changes its display status, and a display pattern P is therefore formed on the display device 200. Specifically, when the photodiode structure layer 250 is in a situation of reversed voltage bias, it has a high sensitivity to light. FIG. 17 depicts a Current-Voltage relationship diagram of a photodiode structure layer 250 according to one example of the present disclosure, in which curve A represents the experimental data of an illuminated photodiode structure layer 250, and curve B represents experimental data of an unilluminated photodiode structure layer 250. As shown in FIG. 17, when the photodiode structure layer 250 is in a situation of reversed voltage bias, the difference in current of the photodiode structure layer between the illuminated and unilluminated conditions has several orders of magnitude. For example, when the voltage is −4 V, the current difference between curve A and curve B is three orders of magnitude, approximately.

Referring back to FIGS. 16A and 16B, when light L illuminates the portion of the photodiode structure layer 250, the current of the illuminated portion may be increased, and the corresponding conductive pad 232a has a negative voltage. Therefore, the display status of the region R (i.e., corresponding to the illuminated portion) of the bistable layer 240 is changed, so that a display pattern P is formed on the display device 200. Although FIG. 16A depicts that light L is transmitted from the side of the photodiode structure layer 250, light (or other electromagnetic waves) may be provided from the side of the first conductive transparent layer 210, and the light reaches the photodiode structure layer 250 and changes the conductivity of the photodiode structure layer 250 so as to achieve the identical effect, according to other embodiments of the present disclosure.

In some examples, the photodiode structure layer 250 includes amorphous silicon, and the light L described above is blue light or green light such as light with a wavelength ranged from about 380 nm to about 580 nm, more specifically approximately 380-480 nm or approximately 480-580 nm. Since amorphous silicon has a relatively higher absorption rate for blue light, the photodiode structure layer 250 illuminated with blue light can provide a significant difference in voltage, thereby forming a display pattern P distinctively. Amorphous silicon has a middle absorption rate for green light, and the experimental results shows that the display device 200 can also exhibit a fair display pattern P. However, amorphous silicon has a relatively lower absorption rate for red light, and the experimental results shows that the display device 200 merely presents a gray pattern P.

In yet some embodiments, the step of allowing the light L to illuminate the portion of the photodiode structure layer 250 through the second conductive transparent layer 220 includes: providing a first light L1 and a second light L2 with different wavelengths to respectively illuminate a first portion A1 and second portion A2 of the photodiode structure layer 250, such that the regions of the bistable layer 240 corresponding to the first and second portions A1, A2 exhibit display patterns with different grays. For instance, the first light L1 is red light, whereas the second light L2 is blue or green light.

In addition, lights with different intensities may also cause display patterns with different grays. Therefore, in yet some examples, the step of allowing the light L to illuminate the portion of the photodiode structure layer 250 through the second conductive transparent layer 220 includes: providing a first light L1 and a second light L2 with different intensities to respectively illuminate a first portion A1 and second portion A2 of the photodiode structure layer 250, such that the regions of the bistable layer 240 corresponding to the first and second portions A1, A2 exhibit display patterns with different grays.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims and their equivalents.

What is claimed is:

1. A method of manufacturing an identifiable element, comprising:
   providing or receiving a display layer, the display layer comprising:
   a bistable layer;
   an electrode layer;
   a conductive transparent layer, wherein the electrode layer and the conductive transparent layer are disposed at opposite sides of the bistable layer; and
   a light-trigger electric change layer disposed between the bistable layer and the conductive transparent layer;
   applying a voltage bias across the electrode layer and the conductive transparent layer; and
   providing a light illuminating a portion of the light-trigger electric change layer through the conductive transparent layer to change a display status of a region of the bistable layer corresponding to the portion of the light-trigger electric change layer, whereby forming a display pattern in the display layer.

2. The method according to claim 1, wherein when the light illuminates the portion of the light-trigger electric change layer, a conductivity or an electrical resistance of the portion of the light-trigger electric change layer increases.

3. The method according to claim 1, wherein the bistable layer has a thickness direction and an extending direction perpendicular to the thickness direction, and the light-trigger electric change layer continuously extends in the extending direction a length which is capable of being recognized by human naked eyes.

4. The method according to claim 1, further comprising:
   removing the voltage bias and the light; and
   fixing the display layer having the display pattern to a carrier after removing the voltage bias and the light.

5. The method according to claim 1, further comprising:
   removing the voltage bias and the light;
   removing the electrode layer from the display layer having the display pattern to expose a surface of the bistable layer, thereby forming a first identifiable element; and
   fixing the first identifiable element to a carrier.

6. The method according to claim 1, further comprising:
   removing the voltage bias and the light;
   removing the conductive transparent layer and the light-trigger electric change layer from the display layer having the display pattern to expose a surface of the bistable layer, thereby forming a second identifiable element; and
   fixing the second identifiable element to a carrier.

7. The method according to claim 1, further comprising:
   removing the voltage bias and the light;
   removing the electrode layer, the conductive transparent layer and the light-trigger electric change layer from the display layer having the display pattern to expose opposite surfaces of the bistable layer, thereby forming a third identifiable element; and fixing the third identifiable element to a carrier.

8. The method according to claim 1, further comprising:
removing the voltage bias and the light;
removing the conductive transparent layer from the display layer having the display pattern, thereby forming a fourth identifiable element; and
fixing the fourth identifiable element to a carrier.

9. An identifiable element, comprising:
a bistable layer;
an electrode layer;
a conductive transparent layer, wherein the electrode layer and the conductive transparent layer are disposed at opposite sides of the bistable layer; and
a light-trigger electric change layer disposed between the bistable layer and the conductive transparent layer.

10. The identifiable element according to claim 9, wherein the light-trigger electric change layer comprises a Schottky barrier generation layer and a semiconductor layer in contact with the Schottky barrier generation layer, wherein the Schottky barrier generation layer is interposed between the bistable layer and the semiconductor layer, and the semiconductor layer is interposed between the Schottky barrier generation layer and the conductive transparent layer.

11. The identifiable element according to claim 9, wherein the light-trigger electric change layer comprises a Schottky barrier generation layer and a semiconductor layer in contact with the Schottky barrier generation layer, wherein the Schottky barrier generation layer is interposed between the semiconductor layer and the conductive transparent layer, and the semiconductor layer interposed between the bistable layer and the Schottky barrier generation layer, wherein the Schottky barrier generation layer is made of a transparent conductive material.

12. The identifiable element according to claim 9, wherein the light-trigger electric change layer comprises a photosensitive conductive material.

13. A method of forming a display pattern, comprising:
providing or receiving a display layer, the display layer comprising:
a bistable layer;
an electrode layer;
a conductive transparent layer, wherein the electrode layer and the conductive transparent layer are disposed at opposite sides of the bistable layer; and
a light-trigger electric change layer disposed between the bistable layer and the conductive transparent layer; and
providing a voltage bias across the electrode layer and the conductive transparent layer, and allowing a light to illuminate a portion of the light-trigger electric change layer through the conductive transparent layer, such that a display status of a region of the bistable layer corresponding to the portion of the light-trigger electric change layer is changed, thereby forming a display pattern in the display layer.

14. A display device, comprising:
a first conductive transparent layer;
a second conductive transparent layer opposite to the first conductive transparent layer;
a bistable layer disposed between the first conductive transparent layer and the second conductive transparent layer; and
a photodiode structure layer disposed between the bistable layer and the second conductive transparent layer, wherein the photodiode structure layer is electrically connected to the bistable layer.

15. The display device according to claim 14, further comprising:
a pixel electrode layer disposed between the bistable layer and the photodiode structure layer, wherein the pixel electrode layer comprises a plurality of conductive pads discrete from each other.

16. The display device according to claim 14, wherein the photodiode structure layer comprises:
a first-type semiconductor layer;
an intrinsic semiconductor layer disposed over the first-type semiconductor layer; and
a second-type semiconductor layer disposed over the intrinsic semiconductor layer.

17. The display device according to claim 15, wherein the photodiode structure layer comprises:
a first-type semiconductor layer;
an intrinsic semiconductor layer disposed over the first-type semiconductor layer; and
a plurality of second-type semiconductor layers disposed over the intrinsic semiconductor layer, wherein the second-type semiconductor layers define a plurality of photodiodes.

18. The display device according to claim 17, wherein each of the conductive pads is disposed on a corresponding one of the second-type semiconductor layers.

19. The display device according to claim 16, wherein two adjacent ones of the second-type semiconductor layers are separated by a trench, and the trench has a depth that is greater than a thickness of each of the second-type semiconductor layers.

20. A method of forming a display pattern, comprising:
providing or receiving a display device of claim 14;
applying a first voltage bias across the first conductive transparent layer and the second conductive transparent layer;
applying a second voltage bias across the first conductive transparent layer and the second conductive transparent layer, wherein the second voltage bias is different from the first voltage bias; and
allowing a light to illuminate a portion of the photodiode structure layer through the second conductive transparent layer such that a display status of a region of the bistable layer corresponding to the portion of the light-trigger electric change layer is changed, thereby forming a display pattern in the display device.

21. The method according to claim 20, wherein when the first voltage bias is a positive voltage bias, the second voltage bias is a negative voltage bias, and when the first voltage bias is a negative voltage bias, the second voltage bias is a positive voltage bias.

22. The method according to claim 20, wherein when applying the first voltage bias, the display device presents a first gray level over an entire display region of the display device, and when applying the second voltage bias, the display device still presents the first gray level over the entire display region.

23. The method according to claim 20, wherein the light has a wavelength ranged from about 380 nm to about 580 nm.

24. The method according to claim 20, wherein allowing the light to illuminate the portion of the photodiode structure layer through the second conductive transparent layer comprising: providing a first light and a second light having different light intensities to respectively illuminate a first portion and a second portion of the photodiode structure layer, such that two regions of the bistable layer corresponding to the first portion and the second portion present two display patterns in different gray levels.

25. The method according to claim 20, wherein allowing the light to illustrate the portion of the photodiode structure layer through the second conductive transparent layer comprising: providing a first light and a second light having different wavelengths to respectively illuminate a first portion and a second portion of the photodiode structure layer, such that two regions of the bistable layer corresponding to the first portions and the second portion present two display patterns in different gray levels.

* * * * *